United States Patent
Watanabe et al.

(10) Patent No.: US 10,793,953 B2
(45) Date of Patent: *Oct. 6, 2020

(54) ACTIVATED GAS GENERATION APPARATUS AND FILM-FORMATION TREATMENT APPARATUS

(71) Applicant: Toshiba Mitsubishi-Electric Industrial Systems Corporation, Chuo-ku (JP)

(72) Inventors: Kensuke Watanabe, Tokyo (JP); Shinichi Nishimura, Tokyo (JP); Yoichiro Tabata, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 189 days.

This patent is subject to a terminal disclaimer.

(21) Appl. No.: 15/766,873

(22) PCT Filed: Jan. 18, 2016

(86) PCT No.: PCT/JP2016/051279
§ 371 (c)(1),
(2) Date: Apr. 9, 2018

(87) PCT Pub. No.: WO2017/126007
PCT Pub. Date: Jul. 27, 2017

(65) Prior Publication Data
US 2018/0291509 A1  Oct. 11, 2018

(51) Int. Cl.
*C23C 16/46* (2006.01)
*C23C 16/513* (2006.01)
(Continued)

(52) U.S. Cl.
CPC ............ *C23C 16/513* (2013.01); *C23C 16/46* (2013.01); *H01J 37/3244* (2013.01);
(Continued)

(58) Field of Classification Search
CPC ........ C23C 16/513; C23C 16/46; H05H 1/24; H05H 1/2406; H05H 2245/123;
(Continued)

(56) References Cited

U.S. PATENT DOCUMENTS

| 2011/0121736 A1 | 5/2011 | Hirayama et al. |
| 2015/0125356 A1 | 5/2015 | Miyamoto et al. |
| 2015/0137677 A1 | 5/2015 | Sohn |

FOREIGN PATENT DOCUMENTS

| CN | 104206026 A | 12/2014 |
| JP | 7-296993 A | 11/1995 |

(Continued)

OTHER PUBLICATIONS

Combined Office Action and Search Report dated Aug. 14, 2019 in Chinese Patent Application No. 201680069682.9, 18 pages (with English translation).

(Continued)

*Primary Examiner* — Yuechuan Yu
(74) *Attorney, Agent, or Firm* — Xsensus LLP

(57) ABSTRACT

In an activated gas generation apparatus, metal electrodes are formed on a bottom surface of a dielectric electrode, and are disposed so as to face each other with a central region of the dielectric electrode interposed therebetween in plan view. The metal electrodes face each other along the Y direction. A wedge-shaped stepped part is provided so as to protrude upward in the central region on an upper surface of the dielectric electrode. The wedge-shaped stepped part is formed so as to have a shorter formation width in the Y direction as approaching each of a plurality of gas spray holes in plan view.

15 Claims, 12 Drawing Sheets

(51) Int. Cl.
*H05H 1/24* (2006.01)
*H01J 37/32* (2006.01)

(52) U.S. Cl.
CPC .. *H01J 37/32348* (2013.01); *H01J 37/32568* (2013.01); *H05H 1/24* (2013.01); *H05H 1/2406* (2013.01); *H05H 2001/2412* (2013.01); *H05H 2240/10* (2013.01); *H05H 2245/123* (2013.01)

(58) Field of Classification Search
CPC ........ H05H 2001/2412; H05H 2240/10; H01J 37/3244; H01J 37/32348; H01J 37/32568
See application file for complete search history.

(56) References Cited

FOREIGN PATENT DOCUMENTS

| | | |
|---|---|---|
| JP | 2537304 B2 | 9/1996 |
| JP | 11-335868 A | 12/1999 |
| JP | 3057065 B2 | 6/2000 |
| JP | 2003-129246 A | 5/2003 |
| JP | 2006-21080 A | 1/2006 |
| JP | 5158084 B2 | 3/2013 |
| JP | 5328685 B2 | 10/2013 |
| WO | WO 2009/069204 A1 | 6/2009 |

OTHER PUBLICATIONS

Extended European Search Report dated Jul. 19, 2019 in corresponding European Patent Application No. 16886250.6, 10 pages.
International Search Report dated Mar. 1, 2016 in PCT/JP2016/051279, filed on Jan. 18, 2016.

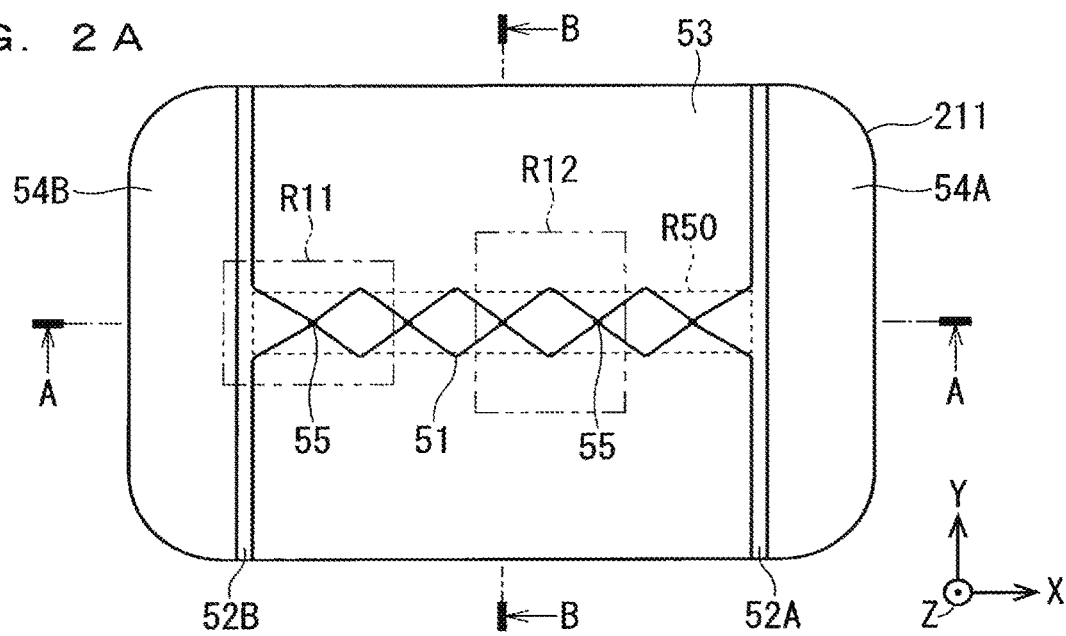
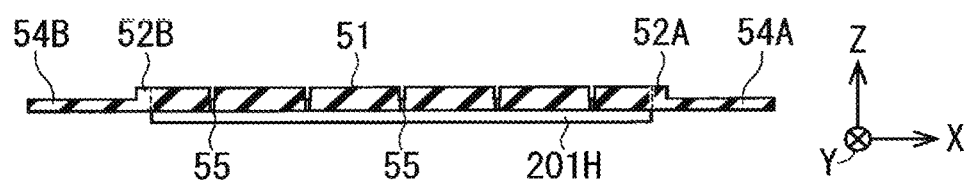
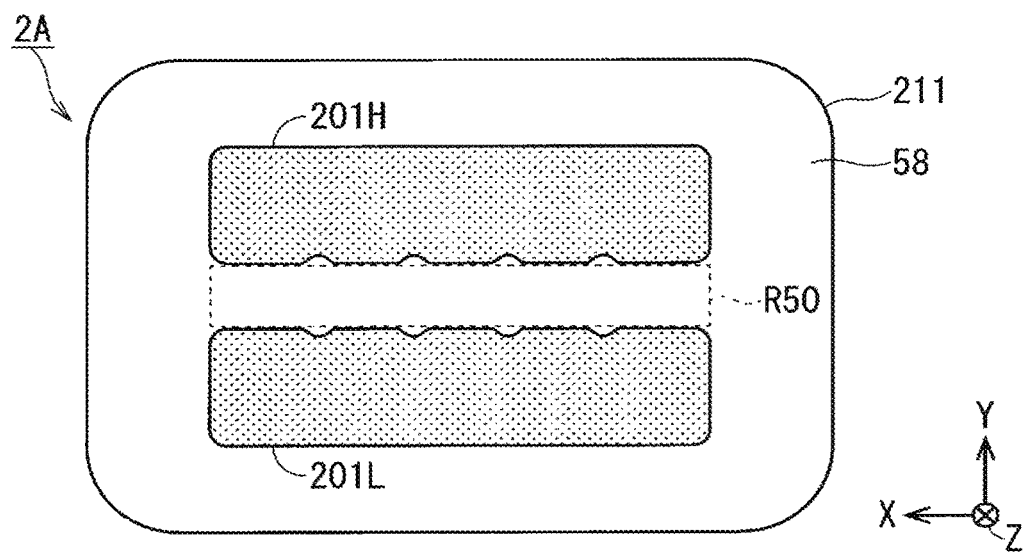
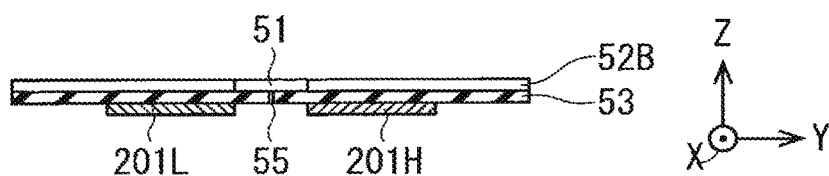

F I G. 5A
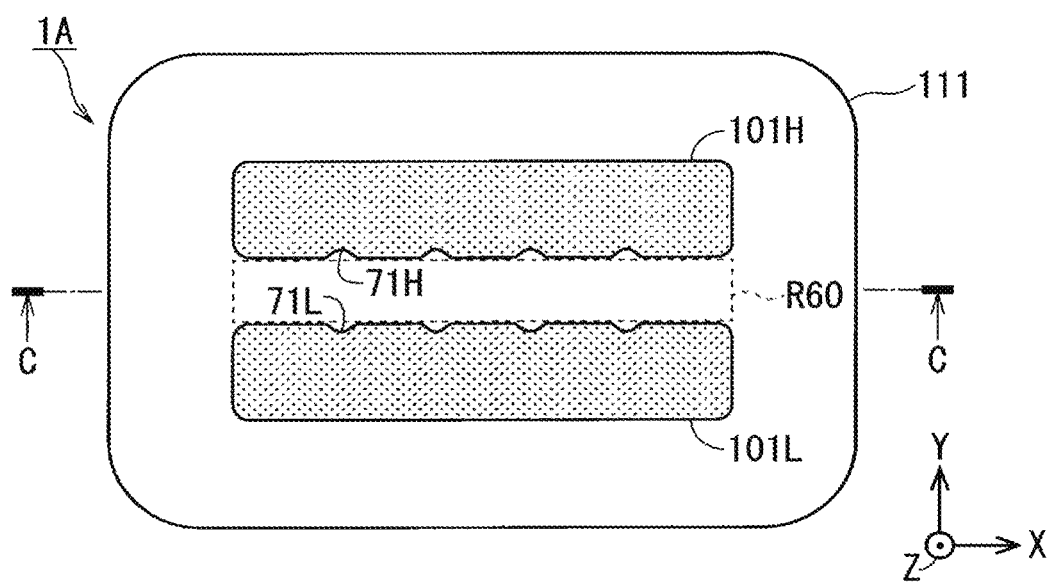
F I G. 5B
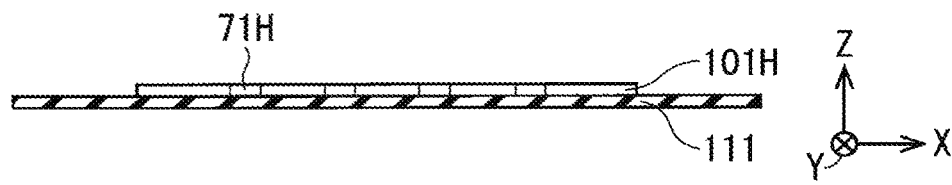
F I G. 5C
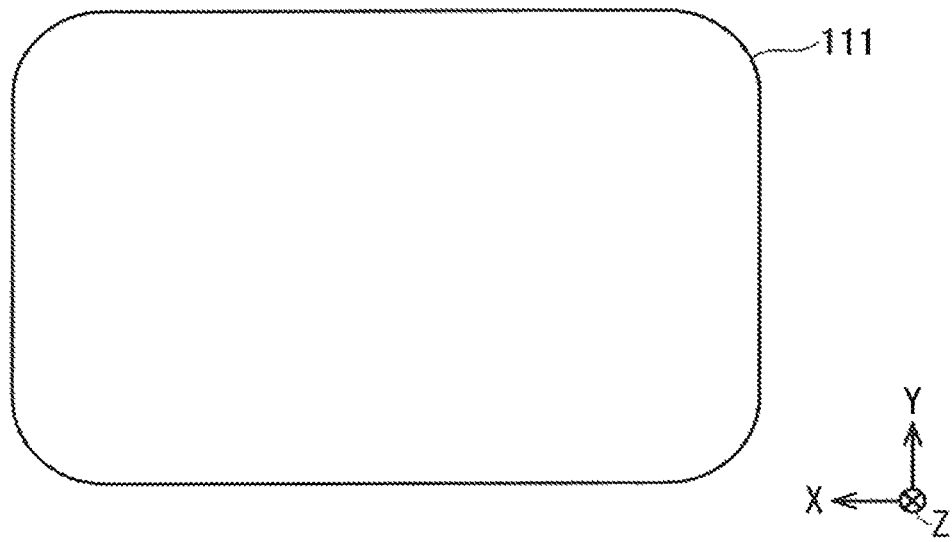

F I G. 1 2
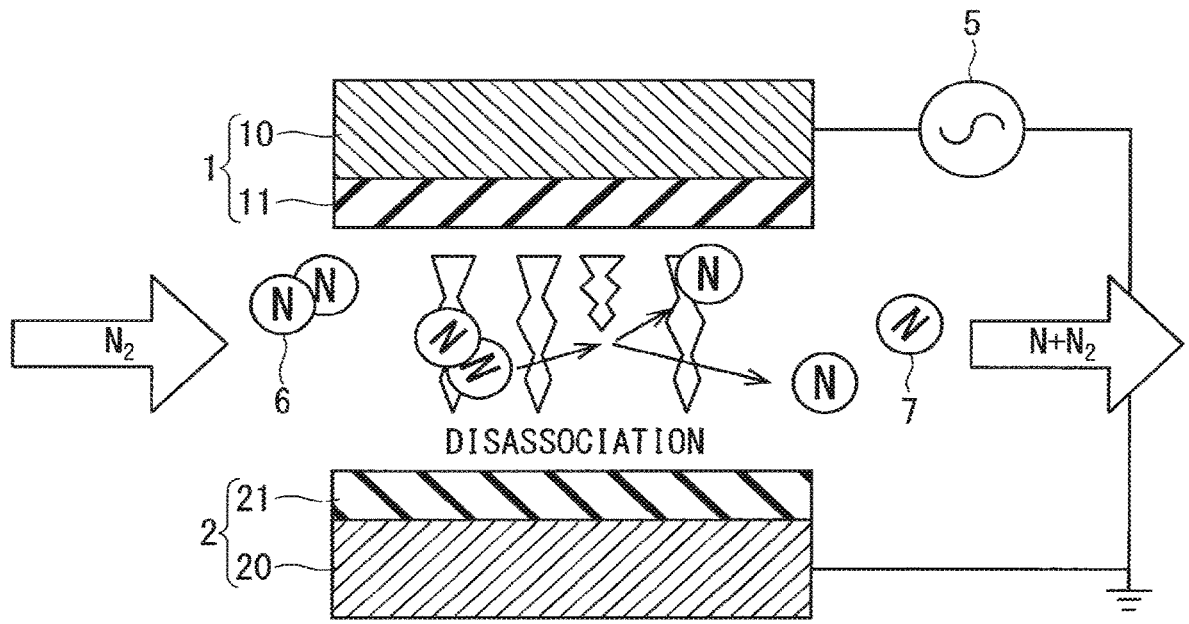
F I G. 1 3
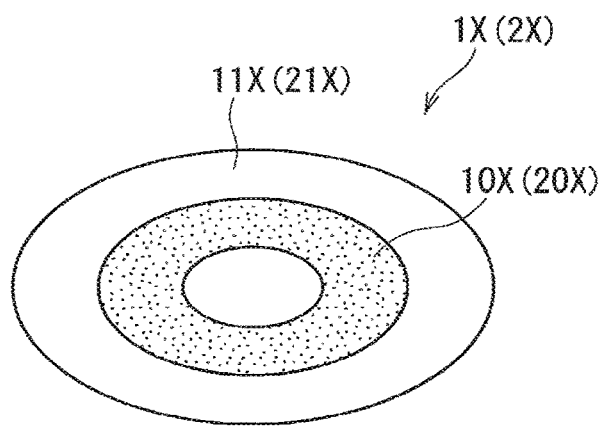

ated gas generation apparatus disclosed in
Patent Document 1, discharge is generated between cylindrical electrodes formed inside and outside a cylinder, and a source gas is introduced between the electrodes to generate an activated gas (radical-containing gas). The flow path of the activated gas is squeezed by a blowout port provided at the tip of the cylinder to spray a plasma jet. The plasma jet treats an object to be treated set immediately therebelow.

ACTIVATED GAS GENERATION APPARATUS AND FILM-FORMATION TREATMENT APPARATUS

TECHNICAL FIELD

The present invention relates to an activated gas generation apparatus in which a high voltage dielectric electrode and a ground dielectric electrode are set in parallel to apply a high voltage between both the electrodes, and an activated gas is obtained with energy generated by discharge.

BACKGROUND ART

In a conventional activated gas generation apparatus, a metal electrode such as an Au film may be formed on a dielectric electrode made of ceramics or the like to form an electrode constituent part. In such an apparatus, the dielectric electrode in the electrode constituent part is a main component, and the metal electrode formed thereon is dependent.

One of the conventional activated gas generation apparatuses is a activated gas generation apparatus in which a disk-shaped electrode constituent part is used; and a source gas penetrating from an outer peripheral part to an inside passes through a discharge space (discharge field), and is sprayed from only one gas spray hole provided in a central part of the electrode to an outside.

Conventional activated gas generation apparatuses including the above-described apparatuses are disclosed, for example, in Patent Document 1, Patent Document 2, Patent Document 3, and Patent Document 4.

In the activated gas generation apparatus disclosed in Patent Document 1, discharge is generated between cylindrical electrodes formed inside and outside a cylinder, and a source gas is introduced between the electrodes to generate an activated gas (radical-containing gas). The flow path of the activated gas is squeezed by a blowout port provided at the tip of the cylinder to spray a plasma jet. The plasma jet treats an object to be treated set immediately therebelow.

In the activated gas generation apparatus disclosed in Patent Document 2, a pair of opposing electrodes are provided in a flat plate form, and set in a vertical form, so that a gas is supplied into the electrodes from the upper side toward the lower side, to treat an object to be treated set immediately below. The activated gas generation apparatus having a flat plate electrode structure is comparatively easily grown in size, which enables a uniform film formation treatment to a large area. The similar treatment apparatus in which the pair of opposed flat plate electrodes are set in a vertical form is used for many other applications such as Patent Document 5 or the like, including not only film formation treatment applications but also surface treatment applications. There is also an apparatus using an apparatus structure in which a plurality of pairs of opposing electrodes are stacked and disposed instead of one pair of opposing electrodes (Patent Document 6).

In the activated gas generation apparatus disclosed in Patent Document 3, a pair of opposing disk-shaped electrodes are provided; a large number of pores are formed in a shower plate form in a ground side electrode among the pair of opposing disk-shaped electrodes; and a discharge part is directly connected to a treatment chamber. The electrodes are enlarged, or a plurality of electrodes themselves are provided, and numerous pores are provided, which can provide uniform large-area nitriding. The discharge space (discharge field) itself is near the atmospheric pressure, while the treatment chamber is placed in further reduced pressure state via the pores. As a result, the activated gas generated in the discharge field is transported under reduced pressure via the pores immediately after generation, to minimize its attenuation, so that the activated gas can arrive at the object to be treated in a higher density state.

In the activated gas generation apparatus disclosed in Patent Document 4, a pair of opposing electrodes having a rectangular flat plate shape are provided; gaps are blocked by spacers on three sides; and the gas is sprayed toward one direction in which a gap is opened. A gas spray hole is provided at the tip of the opening part, to blow an activated gas (radical) onto an object to be treated.

PRIOR ART DOCUMENTS

Patent Documents

Patent Document 1: Japanese Patent No. 3057065
Patent Document 2: Japanese Patent Application Laid-Open No. 2003-129246
Patent Document 3: Japanese Patent No. 5328685
Patent Document 4: Japanese Patent No. 5158084
Patent Document 5: Japanese Patent Application Laid-Open No. 11-335868 (1999)
Patent Document 6: Japanese Patent No. 2537304

SUMMARY

Problem to be Solved by the Invention

In the method for generating the activated gas disclosed in Patent Document 1, the opening part of the blowout port has a diameter of several millimeters, so that a treatment area is extremely limited.

As the activated gas generation apparatus disclosed in Patent Document 1, there is also proposed a configuration in which electrodes are set in a lateral direction, and a plurality of blowout ports are provided along the electrodes. This method can provide a large treatment area. However, the method causes complicated shapes and structures of the cylindrical body and electrode. Considering semiconductor film formation treatment applications which do not permit atmosphere commingling or the like, component connecting parts are required to have sufficient sealing characteristics. A temperature near the discharge space (discharge field) is high, which makes it necessary to separate a high temperature site from a seal material to some extent in order to have a margin even if cooling is performed. Accordingly, this is expected to cause a considerable apparatus size.

In the activated gas generating methods disclosed in Patent Document 2, Patent Document 5, and Patent Document 6, both the discharge space (discharge field) and the object to be treated are basically treated under the same pressure near the atmospheric pressure. The activated gas reacts with others because of its high energy state, or is apt to be easily deactivated by light emission or the like. Since the collision frequency increases as the pressure increases, it is desirable that the generated activated gas is rapidly transferred to reduced pressure even though a pressure state equal to or higher than a certain level cannot be avoided for the sake of expediency of the discharge method in the discharge field. From such a viewpoint, it is conceivable that, in the method disclosed in Patent Document 2 or the like, the radical density has been considerably attenuated when the activated gas arrives at the object to be treated.

On the other hand, in the activated gas generation method disclosed in Patent Document 3, the pores also serve as an orifice, which makes it necessary to, make the total pore cross-sectional area coincide with a cross-sectional area necessary for maintaining a predetermined pressure difference, and makes it impossible to increase the number of the pores to the same extent as that of an original shower plate for a semiconductor film formation treatment. When the number of the pores is small, the difference in gas flow rate according to the arrangement on the electrode is increased, and the flow rate difference for each pore leads directly to the flux of the activated gas, so that unevenness occurs in the film thickness unless the flow rate difference is accurately grasped, and film treatment conditions are accordingly set. The gas advances from the disk-shaped outer peripheral part into the electrodes, and is released from the pores formed in the discharge field to the outside. This naturally causes a difference between the radical density in the gas penetrating into the discharge field and immediately released from the pores and the radical density in the gas disposed on the innermost side and passing through the discharge field over a sufficiently long period of time, and thereafter released, so that a synergistic effect with the difference of gas flow rate makes it extremely difficult to provide a uniform film formation condition.

In the activated gas generation apparatus disclosed in Patent Document 4, the gas spray holes are required to function as an orifice in order to provide the following pressure section: the discharge field is set to be near the atmospheric pressure; and a treatment chamber in which the object to be treated is set under reduced pressure. The electrode constituting the discharge field and the part having the gas spray holes constituting the orifice are different from each other, which requires positioning mechanisms for the electrode and the part. In order to prevent the occurrence of the gap in parts other than the gas spray holes, a sealing mechanism is also required to be provided. Considering the constitution as described above, the apparatus is expected to be extremely complicated.

As described above, in the conventional activated gas generation apparatuses disclosed in Patent Document 1, Patent Document 2, and Patent Document 4 or the like, a region which can be subjected to a film formation treatment is relatively limited to a case of one gas spray hole, and a case of a line-like gas spray hole, or the like. In particular, it is completely impossible to uniformly treat a wafer having a diameter φ of 300 mm. Meanwhile, as in the activated gas generation apparatus disclosed in Patent Document 3, there is means of attaching a shower plate for gas diffusion behind the gas spray holes. However, originally, the activated gas is very highly active, so that the activated gas advances in the shower plate while colliding with the wall surface of the plate, to deactivate most of radicals, which causes a serious problem that the activated gas generation apparatus cannot withstand practical use.

It is an object of the present invention to solve the above problems and to provide an activated gas generation apparatus capable of generating a high-density activated gas.

Means to Solve the Problem

An activated gas generation apparatus according to a first aspect of the present invention includes: a first electrode constituent part; a second electrode constituent part provided below the first electrode constituent part; and an AC power supply part applying an AC voltage to the first and second electrode constituent parts, the AC power supply part apply-ing the AC voltage to form a discharge space between the first and second electrode constituent parts, and to generate an activated gas obtained by activating a source gas supplied to the discharge space, wherein: the first electrode constituent part includes a first dielectric electrode and a first metal electrode selectively formed on an upper surface of the first dielectric electrode; the second electrode constituent part includes a second dielectric electrode and a second metal electrode selectively formed on a bottom surface of the second dielectric electrode; in a dielectric space where the first and second dielectric electrodes face each other by an application of the AC voltage, a region where the first and second metal electrodes overlap each other in plan view is defined as the discharge space; the second metal electrode includes a pair of second partial metal electrodes formed so as to face each other with a central region of the second dielectric electrode interposed therebetween in plan view, and the pair of second partial metal electrodes have a first direction as an electrode formation direction and a second direction intersecting with the first direction, the second partial metal electrodes facing each other along the Y direction; the first metal electrode includes a pair of first partial metal electrodes including a region overlapping with the pair of second partial metal electrodes in plan view, and the second dielectric electrode includes a gas spray hole formed in the central region for spraying the activated gas to an outside, and a central region step part formed so as to protrude upward in the central region; and the central region step part is formed so as to have a shorter formation width in the second direction as approaching the gas spray hole in plan view without overlapping with the gas spray hole in plan view.

An activated gas generation apparatus according to a second aspect of the present invention includes: a first electrode constituent part; a second electrode constituent part provided below the first electrode constituent part; and an AC power supply part applying an AC voltage to the first and second electrode constituent parts, the AC power supply part applying the AC voltage to form a discharge space between the first and second electrode constituent parts, and to generate an activated gas obtained by activating a source gas supplied to the discharge space, wherein: the first electrode constituent part includes a first dielectric electrode and a first metal electrode selectively formed on an upper surface of the first dielectric electrode; the second electrode constituent part includes a second dielectric electrode and a second metal electrode selectively formed on a bottom surface of the second dielectric electrode; in a dielectric space where the first and second dielectric electrodes face each other by an application of the AC voltage, a region where the first and second metal electrodes overlap each other in plan view is defined as the discharge space; the first metal electrode includes a pair of first partial metal electrodes formed so as to face each other with a central region of the first dielectric electrode interposed therebetween in plan view; the pair of first partial metal electrodes have a first direction as an electrode formation direction and a second direction intersecting with the first direction, the first partial metal electrodes facing each other along the Y direction; the second metal electrode includes a pair of second partial metal electrodes including a region overlapping with the pair of first partial metal electrodes in plan view; the second dielectric electrode includes a plurality of gas spray holes formed along the first direction in a region corresponding to the central region in plan view and each spraying the activated gas to an outside; the first dielectric electrode includes a central region step part formed so as to protrude downward in the central region; the central region step part overlaps with all of the plurality of gas spray holes in plan view; and a space below the central region step part in the dielectric space is formed so as to be narrower than the other space.

Effects of the Invention

The activated gas generation apparatus according to the first aspect of the present invention supplies the source gas from the outside toward above the central region of the dielectric space along the second direction, so that the activated gas obtained by causing the source gas pass through the discharge space can be generated, and the activated gas can be sprayed to the outside from the gas spray holes.

In this case, the presence of the central region step part of the first dielectric electrode formed so as to have a shorter formation width in the second direction as approaching the gas spray holes causes the gas flow path of the activated gas above the central region in the dielectric space to be narrowed down, so that the gas flow rate can be increased. As a result, the high-density activated gas can be generated.

The activated gas generation apparatus according to the second aspect of the present invention supplies the source gas toward below the central region of the dielectric space along the second direction, so that the activated gas obtained by causing the source gas pass through the discharge space can be generated, and the activated gas can be sprayed to the outside from the gas spray holes.

In this case, the presence of the central region step part provided in the first dielectric electrode allows the gas flow paths of the activated gas corresponding to the plurality of gas spray holes to be narrowed down below the central region in the dielectric space, so that the gas flow rate can be increased. As a result, the high-density activated gas can be generated.

Furthermore, the central region step part and the plurality of gas spray holes can be separately formed between the first and second dielectric electrodes, so that the strengths of the first and second dielectric electrodes can be increased.

The objects, features, aspects, and advantages of the present invention will become more apparent from the following detailed description and the accompanying drawings.

BRIEF DESCRIPTION OF DRAWINGS

FIGS. 2A to 2D are illustration diagrams showing upper and bottom surface structures or the like of the ground side electrode constituent part of the embodiment 1.

FIGS. 5A to 5C are illustration diagrams showing upper and bottom surface structures or the like of a high-voltage side electrode constituent part.

FIG. 12 is an illustration diagram schematically showing a basic configuration of an activated gas generation apparatus of the present invention.

FIG. 13 is an illustration diagram showing a specific configuration example of a high-voltage side electrode constituent part of FIG. 12.

DESCRIPTION OF EMBODIMENTS

Principle of the Invention

Figure 1:
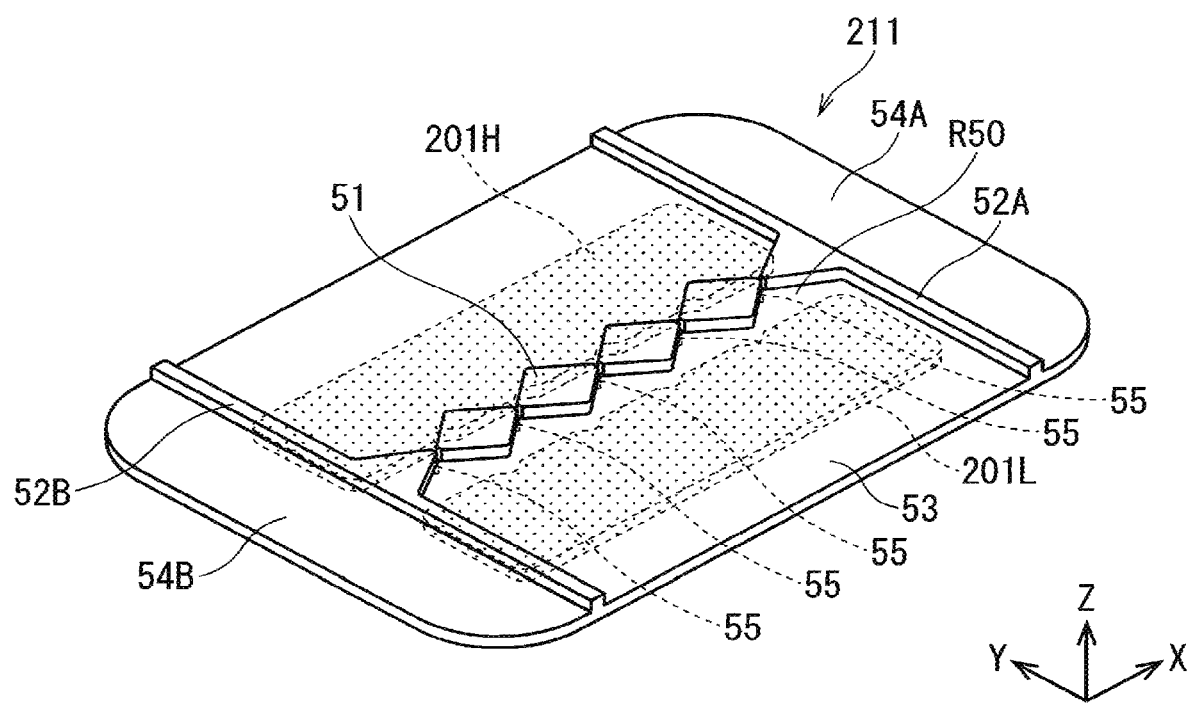
FIG. 1 is a perspective view showing an entire structure of a dielectric electrode of a ground side electrode constituent part in an activated gas generation apparatus of an embodiment 1.

FIG. 12 is an illustration diagram schematically showing a basic configuration of an activated gas generation apparatus of the present invention. As shown in FIG. 12, the activated gas generation apparatus includes, as the basic configuration, a high-voltage side electrode constituent part 1 (first electrode constituent part), a ground side electrode constituent part 2 (second electrode constituent part) provided below the high-voltage side electrode constituent part 1, and a high frequency power supply 5 (AC power supply part) for applying an AC voltage to the high-voltage side electrode constituent part 1 and the ground side electrode constituent part 2.

The high-voltage side electrode constituent part 1 includes a dielectric electrode 11 (first dielectric electrode) and a metal electrode 10 (first metal electrode) selectively formed on the upper surface of the dielectric electrode 11. The ground side electrode constituent part 2 includes a dielectric electrode 21 (second dielectric electrode) and a metal electrode 20 (second metal electrode) selectively formed on the bottom surface of the dielectric electrode 21. The metal electrode 20 of the ground side electrode constituent part 2 is connected to the ground level, and the AC voltage is applied from the high frequency power supply 5 to the metal electrode 10 of the high-voltage side electrode constituent part 1.

By the application of the AC voltage of the high frequency power supply 5, a region where the metal electrodes 10 and 20 overlap with each other in plan view is defined as a discharge space in a dielectric space where the dielectric electrodes 11 and 21 face each other. An activated gas generating electrode group is constituted by the above-described high-voltage side electrode constituent part 1, ground side electrode constituent part 2, and high frequency power supply 5.

In such a configuration, the discharge space is formed between the high-voltage side electrode constituent part 1 and the ground side electrode constituent part 2 by the application of the AC voltage by the high frequency power supply 5, and a source gas 6 such as nitrogen molecules is supplied into the discharge space, to allow an activated gas 7 such as radicalized nitrogen atoms or the like to be obtained.

FIG. 13 is an illustration diagram showing a specific configuration example of the high-voltage side electrode constituent part 1. A high-voltage side electrode constituent part 1X which is one specific example of the high-voltage side electrode constituent part 1 is constituted by selectively forming a metal electrode 10X having a ring shape in plan view on the upper surface of a dielectric electrode 11X having a circular shape in plan view. A ground side electrode constituent part 2X which is one specific example of the ground side electrode constituent part 2 is constituted by selectively forming a metal electrode 20X having a ring shape in plan view on the bottom surface of a dielectric electrode 21X having a circular shape in plan view (upside down in FIG. 13). That is, the ground side electrode constituent part 2X is formed so as to have similar configuration as that of the high-voltage side electrode constituent part 1X except that a vertical relationship between the metal electrode 20X and the dielectric electrode 21X is different from that between the metal electrode 10X and the dielectric electrode 11X. However, the ground side electrode constituent part 2X is different from the high-voltage side electrode constituent part 1X in that a gas spray hole 25 (not shown in FIG. 13) is provided at the center of the dielectric electrode 21X.

Figure 14:
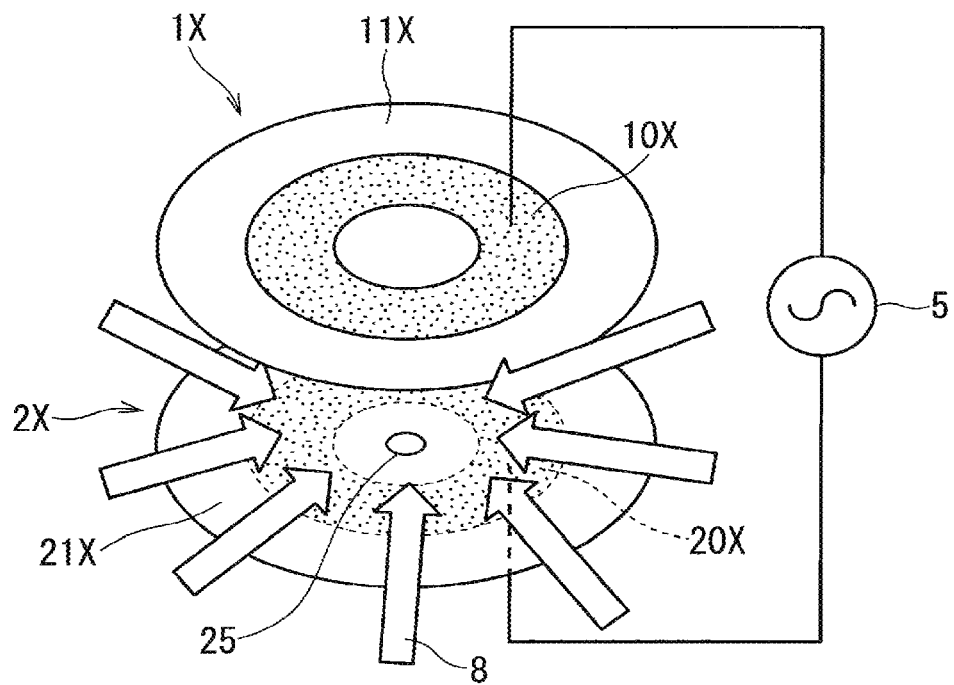
FIG. 14 is an illustration diagram schematically showing a basic configuration of an activated gas generation apparatus.

FIG. 14 is an illustration diagram schematically showing a basic configuration of the activated gas generation apparatus achieved by the high-voltage side electrode constituent part 1X and the ground side electrode constituent part 2X shown in FIG. 13.

As shown in FIG. 14, the activated gas generation apparatus includes, as the basic configuration, the high-voltage side electrode constituent part 1X (first electrode constituent part), the ground side electrode constituent part 2X (second electrode constituent part) provided below the high-voltage side electrode constituent part 1, and the high frequency power supply 5 (AC power supply part) for applying an AC voltage to the high-voltage side electrode constituent part 1X and the ground side electrode constituent part 2X.

The region where the metal electrodes 10X and 20X overlap with each other in plan view is defined as a discharge space (discharge field) in the dielectric space where the dielectric electrodes 11X and 21X face each other by the application of the AC voltage of the high frequency power supply 5. The above-described high-voltage side electrode constituent part 1X, ground side electrode constituent part 2X, and high frequency power supply 5 constitute the activated gas generating electrode group.

In such a configuration, the discharge space is formed between the high-voltage side electrode constituent part 1X and the ground side electrode constituent part 2X by the application of the AC voltage by the high frequency power supply 5, and a source gas is supplied along a gas flow 8 into the discharge space, to obtain the activated gas 7 such as radicalized nitrogen atoms, which allows the activated gas 7 to be sprayed to a lower outside from the gas spray hole 25 provided at the center of the dielectric electrode 21X.

Figure 15:
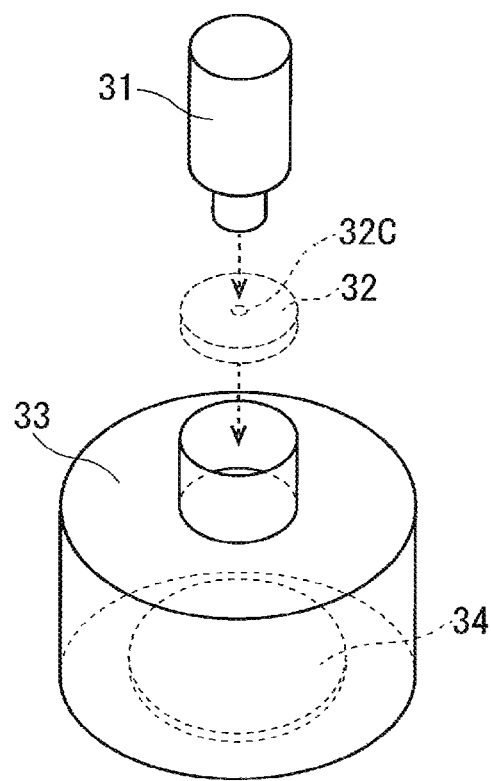
FIG. 15 is an illustration diagram schematically showing a configuration of a film-formation treatment apparatus including an activated gas generation apparatus as a constituent element.

FIG. 15 is an illustration diagram schematically showing a configuration of a film-formation treatment apparatus including the above activated gas generation apparatus as a constituent element.

As shown in FIG. 15, a film formation treatment chamber 33 is disposed below an activated gas generation apparatus 31 in which the activated gas generating electrode group shown in FIGS. 12 to 14 is stored in a housing, with an orifice forming part 32 sandwiched between the film formation treatment chamber 33 and the activated gas generation apparatus 31. For example, a wafer 34 having a diameter ϕ of 300 mm is disposed in the film formation treatment chamber 33.

In this case, the internal portion of the film formation treatment chamber 33 is set at a reduced pressure of about a few hundred Pa, while the internal portion of the activated gas generation apparatus 31 is kept in a high pressure state of about 10 kPa to about the atmospheric pressure in terms of the characteristics of the electrical discharge method. In order to provide a pressure difference therebetween, the gas spray hole 25 provided in the dielectric electrode 21X may have a size that functions as an orifice as in a center hole 32C of the orifice forming part 32.

Therefore, the film formation treatment chamber 33 is provided immediately below the activated gas generation apparatus 31 including the activated gas generating electrode group shown in FIGS. 12 to 14 therein, and the gas spray hole 25 of the dielectric electrode 21X is caused to function as the center hole 32C of the orifice forming part 32, which makes it possible to achieve the film-formation treatment apparatus in which the film formation treatment chamber 33 is disposed immediately below the activated gas generation apparatus 31 without requiring the orifice forming part 32.

In embodiments 1 to 3 to be described below, the activated gas generation apparatus 31 includes the activated gas generating electrode group therein. In the activated gas generating electrode group, the structures of the high-voltage side electrode constituent part 1 (1X) and the ground side electrode constituent part 2 (2A) shown in FIGS. 12 to 14 are improved.

Embodiment 1

Figure 3A:
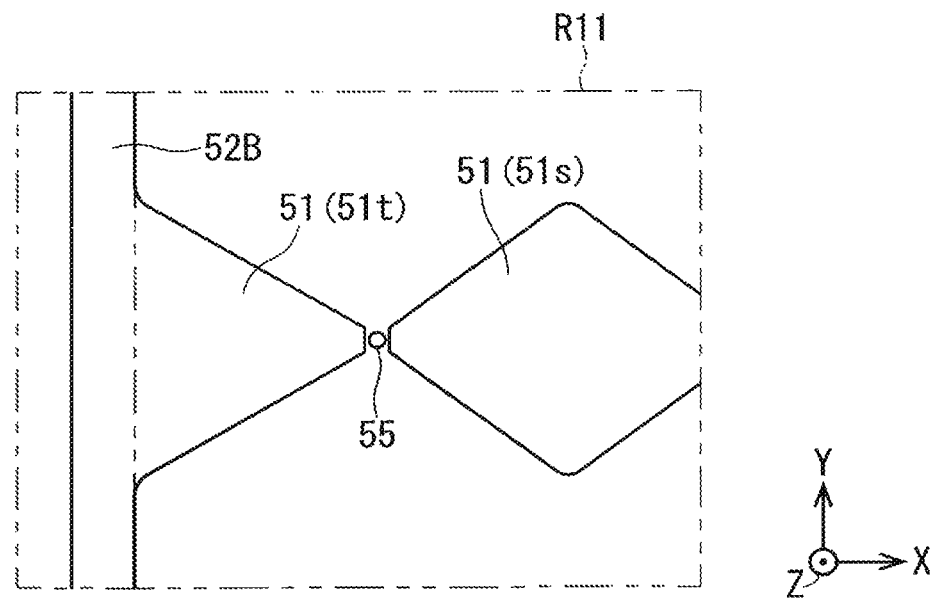
FIGS. 3A and 3B are enlarged illustration diagrams showing a focused region of FIGS. 2A to 2D.
Figure 3B:
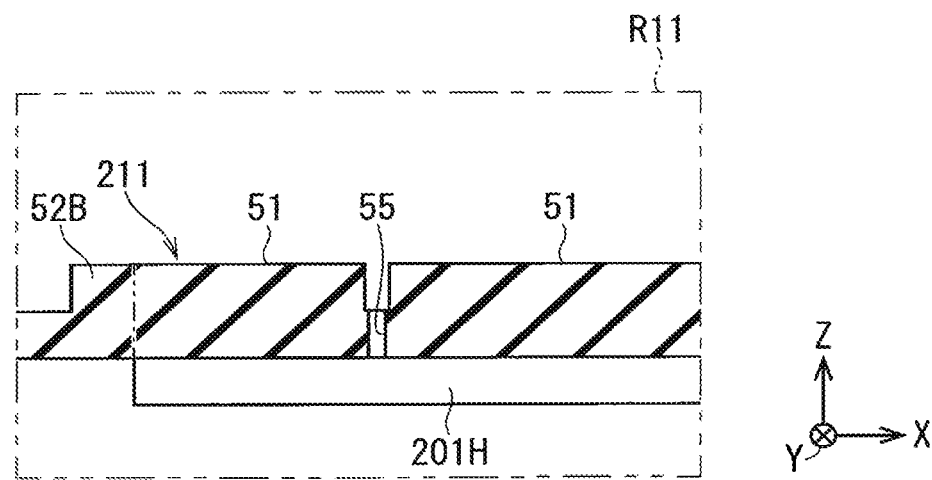

FIG. 1 is a perspective view showing an entire structure of a dielectric electrode 211 of a ground side electrode constituent part 2A in an activated gas generation apparatus of an embodiment 1. FIGS. 2A to 2D are illustration diagrams showing upper and bottom surface structures or the like of the ground side electrode constituent part 2A. FIG. 2A is a top view; FIG. 2B is a cross-sectional view taken along line A-A in FIG. 2A; FIG. 2C is a bottom view, and FIG. 2D is a cross-sectional view taken along line B-B in FIG. 2A. FIGS. 3A and 3B are enlarged illustration diagrams showing a focused region R11 of FIG. 2A. FIG. 3A is a top view; and FIG. 3B is a cross-sectional view taken along line A-A in the focused region R11. An XYZ coordinate system is appropriately shown in each of FIGS. 1 to 3B.

As shown in FIGS. 1 to 3B, the ground side electrode constituent part 2A (second electrode constituent part) of the embodiment 1 includes the dielectric electrode 211 and metal electrodes 201H, 201L (a pair of second partial metal electrodes; second metal electrode).

The dielectric electrode 211 has a rectangular flat plate structure with an X direction as a longitudinal direction and a Y direction as a short direction. Hereinafter, in the dielectric electrode 211, with linear stepped parts 52A, 52B described below as boundaries, a central part may be referred to as a main region 53, and both end parts may be referred to as end regions 54A, 54B.

With respect to the dielectric electrode 211 (second dielectric electrode), a plurality of (five) gas spray holes 55 are provided along the X direction (first direction) in a central region R50 in the main region 53. The plurality of gas spray holes 55 are provided so as to pass through the dielectric electrode 211 from the upper surface to the bottom surface.

As shown in FIGS. 2B and 2C, the metal electrodes 201H, 201L (a pair of second partial metal electrodes) are formed on the bottom surface of the dielectric electrode 211, and disposed so as to face each other with the central region R50 of the dielectric electrode 211 sandwiched therebetween in plan view. The metal electrodes 201H, 201L have a substantially rectangular shape in plan view, and have the X direction (first direction) as the longitudinal direction (electrode formation direction), and the Y direction (second direction) crossing at a right angle to the X direction. The metal electrodes 201H, 201L face each other along the Y direction. The metal electrodes 201H, 201L are equal to each other in size in plan view, and are symmetrically disposed with the central region R50 as the center.

The metal electrodes 201H, 201L are formed by a metalization treatment on the bottom surface of the dielectric electrode 211. As a result, the dielectric electrode 211 and the metal electrodes 201H, 201L are integrally formed to constitute the ground side electrode constituent part 2A (second electrode constituent part). Examples of the metalization treatment include treatments using a printing firing method, a sputtering treatment, and a vapor deposition treatment or the like.

FIGS. 5A to 5C are illustration diagrams showing upper and bottom surface structures or the like of a high-voltage side electrode constituent part 1A (first electrode constituent part). FIG. 5A is a top view; FIG. 5B is a cross-sectional view taken along line C-C of FIG. 5A; and FIG. 5C is a bottom view. In FIGS. 5A to 5C, an XYZ coordinate system is appropriately shown.

As shown in FIGS. 5A to 5C, a dielectric electrode 111 has a rectangular flat plate structure with an X direction as a longitudinal direction and a Y direction as a short direction as with the dielectric electrode 211.

Metal electrodes 101H, 101L (a pair of first partial metal electrodes; first metal electrode) are formed on the upper surface of the dielectric electrode 111, and are disposed so as to face each other with a central region R60 sandwiched therebetween. The central region R60 has a shape equal to that of the central region R50 of the dielectric electrode 211 in plan view. In this case, as with the metal electrodes 201H, 201L, the metal electrodes 101H, 101L have a substantially rectangular shape in plan view, and have the X direction (first direction) as the longitudinal direction (electrode formation direction), and the Y direction (second direction) crossing at a right angle to the X direction. The metal electrodes 101H, 101L face each other along the Y direction. The metal electrodes 101H, 101L are equal to each other in size in plan view, and are symmetrically disposed with the central region R60 as the center. However, the widths of the metal electrodes 101H, 101L in the short direction (Y direction) and in the longitudinal direction (X direction) are set to be slightly shorter than those of the metal electrodes 201H, 201L. The metal electrodes 101H, 101L can be formed on the upper surface of the dielectric electrode 111 by the metalization treatment as with the metal electrodes 201H, 201L.

Figure 6:
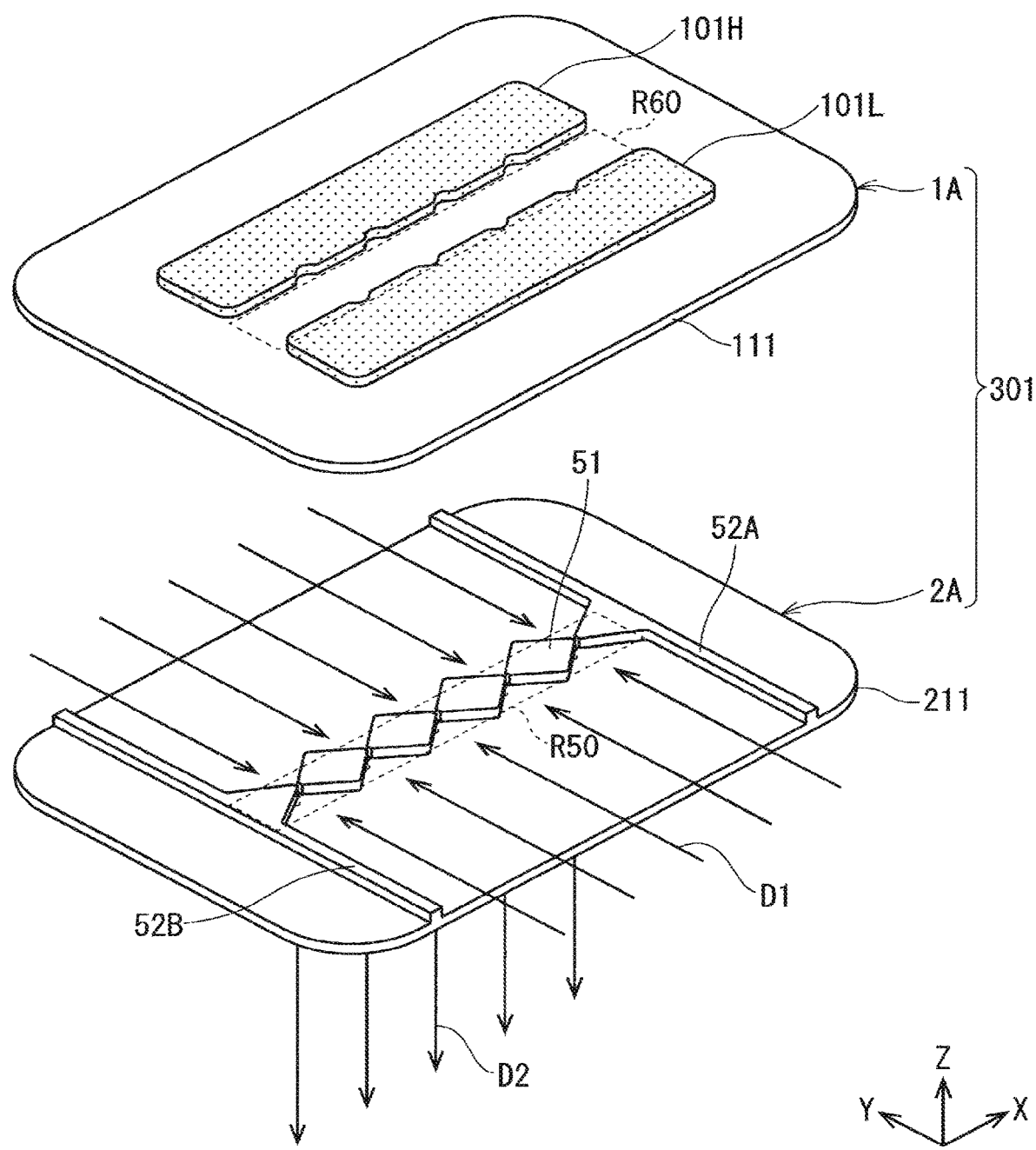
FIG. 6 is a perspective view (part 1) showing an assembling process of the high-voltage side electrode constituent part and the ground side electrode constituent part.
Figure 7:
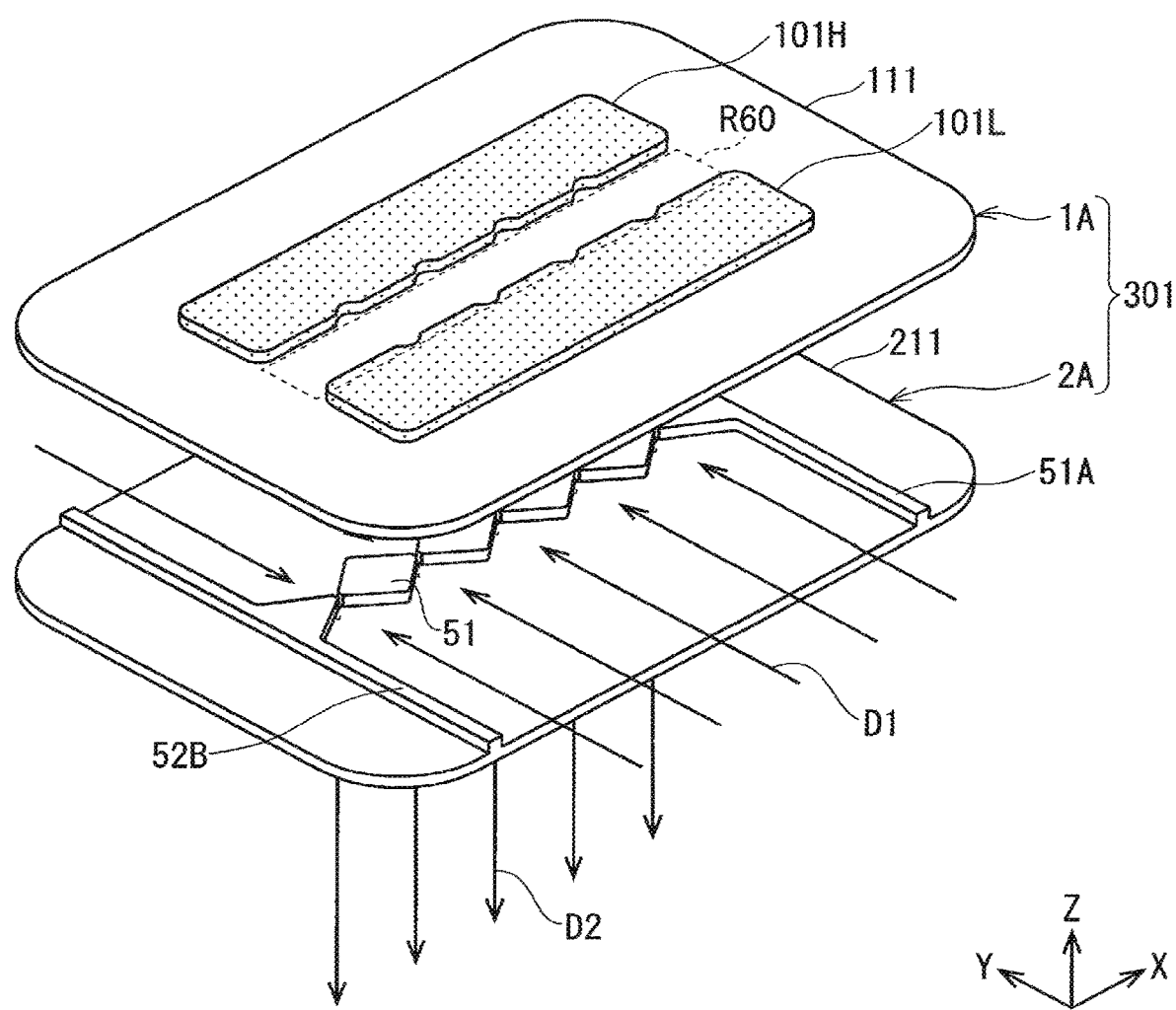
FIG. 7 is a perspective view (part 2) showing the assembling process of the high-voltage side electrode constituent part and the ground side electrode constituent part.
Figure 8:
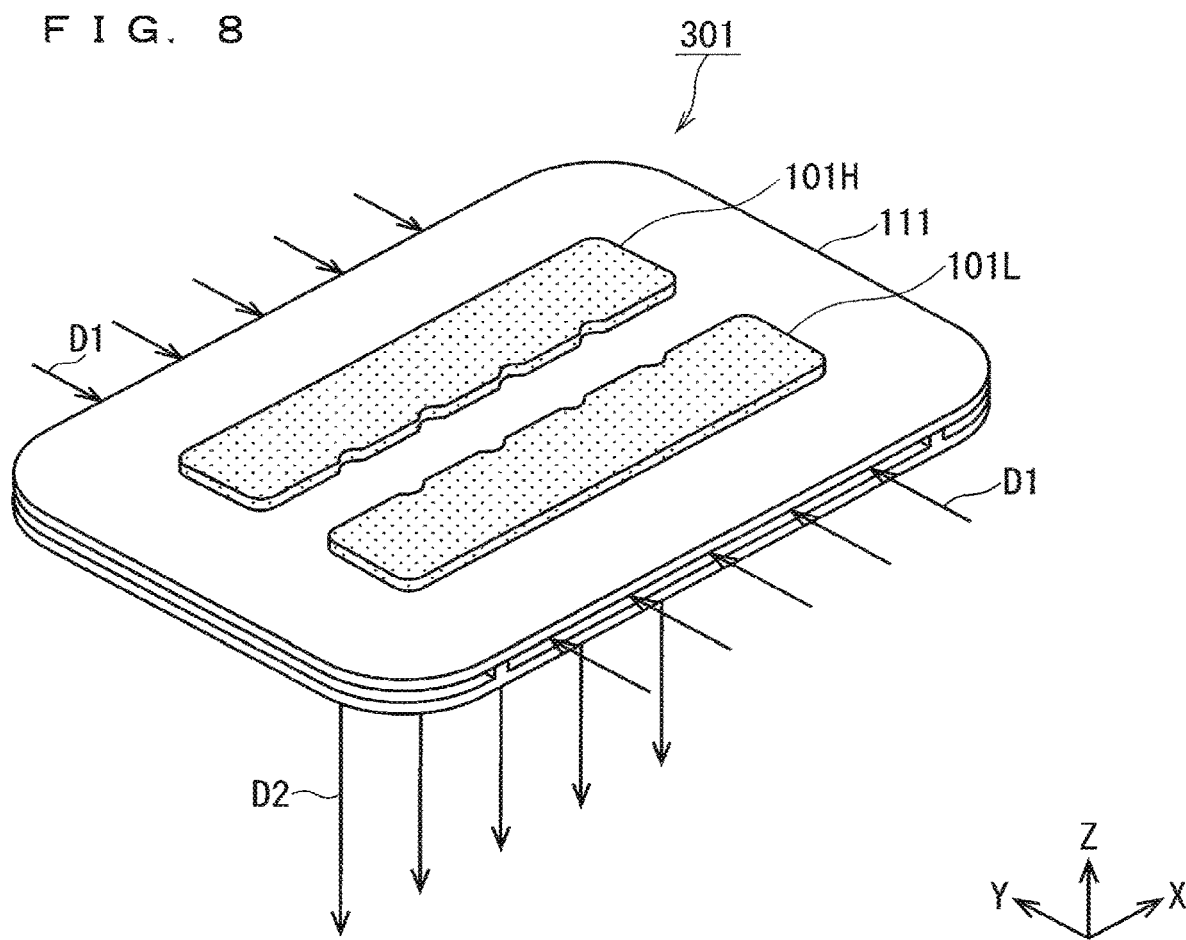
FIG. 8 is a perspective view (part 3) showing the assembling process of the high-voltage side electrode constituent part and the ground side electrode constituent part.

FIGS. 6 to 8 are perspective views showing an assembling process of the high-voltage side electrode constituent part 1A and the ground side electrode constituent part 2A. In FIGS. 6 to 8, an XYZ coordinate system is appropriately shown.

As shown in FIG. 6, an activated gas generating electrode group 301 can be assembled by disposing the high-voltage side electrode constituent part 1A on the ground side electrode constituent part 2A. As shown in FIGS. 6 and 7, while the central region R60 of the dielectric electrode 111 in the high-voltage side electrode constituent part 1A and the central region R50 of the dielectric electrode 211 in the ground side electrode constituent part 2A are positioned so as to overlap with each other in plan view, the high-voltage side electrode constituent part 1A is stacked on the ground side electrode constituent part 2A for assembling, so that the activated gas generating electrode group 301 can be finally completed as shown in FIG. 8.

In the dielectric space in which the dielectric electrode 111 and the dielectric electrode 211 constituting the activated gas generating electrode group 301 face each other, a region in which the metal electrodes 101H, 101L and the metal electrodes 201H, 201L overlap with each other in plan view is defined as a discharge space.

The metal electrodes 101H, 101L and the metal electrodes 201H, 201L which are metalization parts are connected to the (high voltage) high frequency power supply 5 as in the metal electrodes 10, 20 shown in FIG. 12. The metal electrodes 201H, 201L of the ground side electrode constituent part 2A are grounded. In the present embodiment, a 0 peak value is fixed at 2 to 10 kV from the high frequency power supply 5, and an AC voltage set at a frequency of 10 kHz to 100 kHz is applied between the metal electrodes 101H, 101L and the metal electrodes 201H, 201L.

As described above, unlike the dielectric electrode 211 of the ground side electrode constituent part 2A, the dielectric electrode 111 of the high-voltage side electrode constituent part 1A has upper and bottom surfaces each having a flat shape. Therefore, when the high-voltage side electrode constituent part 1A is combined with the ground side electrode constituent part 2A, the high-voltage side electrode constituent part 1A and the ground side electrode constituent part 2A are merely fixed from the upper side to the ground side electrode constituent part 2A side by a fastening force such as a spring or a bolt or the like. The high-voltage side electrode constituent part 1A and the ground side electrode constituent part 2A are not positioned by forming a counter boring shape or the like, which can provide the activated gas generating electrode group 301 which minimizes the possibility of occurrence of contamination due to the contact between the end faces of the dielectric electrode 111 and the dielectric electrode 211 during transportation or the like.

The discharge space (discharge field) described above cannot be brought close to the gas spray holes 55 by a certain interval or more in order to suppress abnormal discharge. Therefore, the space above the central region R50 (R60) from the discharge space to the gas spray holes 55 becomes a non-discharge space (non-discharge field, dead space). In the non-discharge space, an activated gas is merely decreased without being generated.

When the activated gas is generated in the discharge space, and passes through the discharge space, the activated gas is rapidly attenuated because of its high energy, and annihilates in a short time. In the case of the attenuation mechanism of activated gas that loses energy due to collision with other molecules in a ground state or the like, the rate of annihilation of the activated gas can be suppressed by simply lowering a pressure to merely lower a collision frequency. That is, it is important to promptly spray the activated gas generated in the discharge space near the atmospheric pressure to the film formation treatment chamber 33 (see FIG. 15) under reduced pressure. Therefore, the width in the Y direction of the central region R50 (R60) defining the non-discharge space described above is desirably made to be as narrow as possible.

The discharge space cannot be brought close to the gas spray holes 55 in order to minimize the non-discharge space. This is because abnormal discharge may occur when the activated gas is generated if the gas spray holes 55 are brought too close to the discharge space. Therefore, in order to fill the non-discharge space, the activated gas generation apparatus of the embodiment 1 is characterized in that a wedge-shaped stepped part 51 (central region step part) projects upward in the central region R50 of the upper surface of the dielectric electrode 211, and is integrally formed as the constituent element of the dielectric electrode 211.

That is, the wedge-shaped stepped part 51 is formed so as to have a shorter formation width in the Y direction (second direction) as approaching each of the plurality of gas spray holes 55 in plan view without overlapping with the plurality of gas spray holes 55 in plan view. Specifically, the wedge-shaped stepped part 51 is formed by an aggregate of four rhombic shaped single body parts 51$s$ (see FIG. 3A) which are formed in a rhombic shape in plan view between the five gas spray holes 55 and are discrete from each other, and two triangular single body parts 51$t$ (see FIG. 3A each having an approximately isosceles triangular shape in plan view provided outside the gas spray holes 55 on both ends among the five gas spray holes 55.

Therefore, the source gas is supplied from the outside toward above the central region R50 (below the central region R60) in the dielectric space along the Y direction (gas supply direction D1 shown in FIGS. 6 to 8), so that the activated gas obtained when the source gas passes through the discharge space can be generated, and sprayed from the plurality of gas spray holes 55 to the outside along a −Z direction (gas spray direction D2 shown in FIGS. 6 to 8).

In this case, the presence of the wedge-shaped stepped part 51 (central region step part) having four rhombic shaped single body parts 51$s$ and two triangular single body parts 51$t$ each discretely formed so as to have a shorter formation width in the Y direction as approaching each of the plurality of gas spray holes 55 allows a plurality of gas flow paths of the activated gas corresponding to the plurality of gas spray holes 55 to be narrowed down above the central region R50 (below the central region R60) in the dielectric space. As a result, the activated gas generation apparatus of the embodiment 1 can increase gas flow rate in each of the gas spray holes 55. As a result, a higher-density activated gas can be generated.

Needless to say, in addition to the planar shape such as that of the wedge-shaped stepped part 51, the planar shape may be, for example, a semicircular shape, and as long as the planar shape is a shape formed so as to have a shorter formation width in the Y direction (second direction) as approaching each of the gas spray holes 55 in plan view without overlapping with the plurality of gas spray holes 55 in plan view, the above effect can be achieved.

Examples of the source gas include a gas containing at least one of nitrogen, oxygen, fluorine, and hydrogen. That is, an aspect of supplying a gas such as oxygen, rare gases, hydrogen, or fluorines as the source gas is considered. These source gases advance from an outer peripheral part of the activated gas generating electrode group 301 to an inside along the gas supply direction D1, and become the activated gas via the discharge space. The activated gas (gas containing radicals) is sprayed from the plurality of gas spray holes 55 provided in the dielectric electrode 211 to the film formation treatment chamber 33 (see FIG. 15) along the gas spray direction D2. By using the highly reactive activated gas in the film formation treatment chamber 33, the wafer 34 as a substrate to be treated can be subjected to a film-formation treatment.

As described above, a higher-density activated gas can be generated from the source gas containing at least one of nitrogen, oxygen, fluorine, and hydrogen.

The wedge-shaped stepped part 51 is provided on the upper surface of not the dielectric electrode 111 of the high-voltage side electrode constituent part 1A but the dielectric electrode 211 of the ground side electrode constituent part 2A. That is, the plurality of gas spray holes 55 and the wedge-shaped stepped part 51 are formed in the same dielectric electrode 111. As shown in FIGS. 6 to 8, this eliminates the need for positioning the plurality of gas spray holes 55 and the wedge-shaped stepped part 51 when the activated gas generating electrode group 301 is assembled, and can also achieve the simplification of the apparatus configuration.

The wedge-shaped stepped part 51 also functions as a spacer defining a gap length (a distance in a Z direction between the dielectric electrode 11 and the dielectric electrode 21) in the discharge space between the high-voltage side electrode constituent part 1 and the ground side electrode constituent part 2.

Therefore, as shown in FIGS. 6 to 8, by a formation height of the wedge-shaped stepped part 51 according to a simple assembling process of laminating the high-voltage side electrode constituent part 1A on the ground side electrode constituent part 2A, the gap length in the discharge space can be set.

Conventionally, the spacer is often formed in the discharge space. In this case, creeping discharge going through the side face of the spacer occurs, which causes discharge loss and contamination occurrence. In the present embodiment, the wedge-shaped stepped part 51 provided so as to protrude on the upper surface of the dielectric electrode 211 is provided in the central region R50 outside the discharge space, so that the wedge-shaped stepped part 51 leads to the suppression of the contamination occurrence or the like.

As shown in FIGS. 1 to 3B, in a boundary region between the main region 53 and the end regions 54A, 54B present on both end sides, the dielectric electrode 211 further includes the linear stepped parts 52A, 52B (a pair of end region step parts) formed so as to protrude upward. The linear stepped parts 52A, 52B are formed so as to extend in the Y direction over the entire length in the short direction of the dielectric electrode 211 in plan view. The gap length in the discharge space is defined by the formation heights of the linear stepped parts 52A, 52B together with the formation height of the wedge-shaped stepped part 51.

The presence of the linear stepped parts 52A, 52B regulates the inflow of the gas into the discharge space from both the end parts in the X direction of the dielectric electrode 211. When the gas can flow in from both the end parts of the dielectric electrode 211 the gas spray holes 55 (the gas spray hole 55 present on the rightmost or leftmost side in FIG. 1) near both the end parts of the dielectric electrode 211 are apt to be influenced by the inflow amount of the activated gas, so that the calculation of the gas flow rate of the activated gas from each of the gas spray holes 55 is complicated, which causes a problem of difficult control. The problem is eliminated by providing the linear stepped parts 52A, 52B.

By providing the linear stepped parts 52A, 52B, a gas inflow path between the high-voltage side electrode constituent part 1A and the ground side electrode constituent part 2A is provided only from two surfaces in the Y direction. Therefore, the gas flow itself is relatively stabilized, so that a pressure distribution in the discharge space is constant, which can provide a uniform discharge space.

As described above, the dielectric electrode 211 further includes the linear stepped parts 52A, 52B, so that, even in the gas spray hole 55 close to both the end parts in the X direction among the plurality of gas spray holes 55, the influence of the inflow of an unintended gas or the like from both the end parts causes no phenomenon that the inflow amount of the activated gas changes. This makes it possible to spray the activated gas without causing variations among the plurality of gas spray holes 55. As a result, the pressure distribution is constant, the flow rates of the plurality of gas spray holes 55 are equal to each other, and the activated gas generation apparatus according to the embodiment 1 exhibits an effect of providing the generated radical density relatively equal to each other in the activated gas passing through the discharge space.

Figure 4:
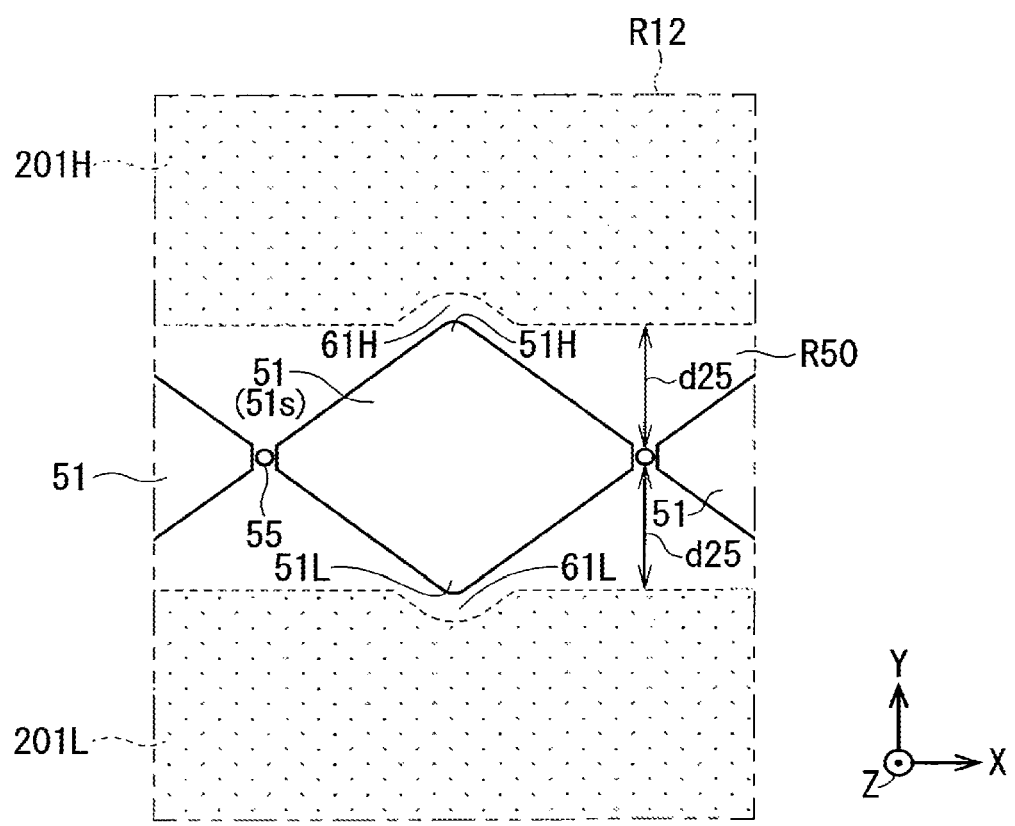
FIG. 4 is an enlarged top view of the focused region of FIGS. 2A to 2D.

As shown in FIG. 4 described later, a non-discharge distance d25 which is a distance in the Y direction between the discharge space (end parts on the central region R50 side of the metal electrodes 201H, 201L) and the plurality of gas spray holes 55 is set to 10 mm or more.

As described above, the non-discharge distance d25 is set to 10 mm or more, which makes it possible to hardly occur abnormal discharge when the activated gas is generated.

FIG. 4 is an enlarged top view of a focused region R12 of FIG. 2A. In FIG. 4, an XYZ coordinate system is appropriately shown. As shown in FIG. 4, in order to minimize the non-discharge space, end parts 51H, 51L providing the longest formation length in the Y direction of the wedge-shaped stepped part 51 extend to positions adjacent to the metal electrodes 201H, 201L forming the discharge space. When the end parts 51H, 51L of the wedge-shaped stepped part 51 and the metal electrodes 201H, 201L overlap with each other, abnormal discharge may be induced when the activated gas is generated, so that cutout parts 61H, 61L having a substantially triangular shape in plan view are provided in regions corresponding to the end parts 51H, 51L in the metal electrodes 201H, 201L defining the discharge space. As a result, a predetermined reference distance (for example, 2 to 3 mm) is secured between the wedge-shaped stepped part 51 and the metal electrodes 201H, 201L.

Similarly, as shown in FIGS. 5A, 5B, the metal electrodes 101H, 101L also have cutout parts 71H and 71L at positions corresponding to the end parts 51H, 51L.

As described above, the planar shapes of the metal electrodes 101H, 101L and the metal electrodes 201H, 201L are set so that a shortest distance in plan view between the discharge space defined by the overlapping area in plan view of the metal electrodes 101H, 101L and the metal electrodes 201H, 201L, and the wedge-shaped stepped part 51 is equal to or greater than a predetermined reference distance, which makes it possible to prevent abnormal discharge from occurring when the activated gas is generated.

As described above, the widths of the metal electrodes 101H, 101L in the short direction (Y direction) and the longitudinal direction (X direction) are set to be slightly shorter than those of the metal electrodes 201H, 201L, so that planar shapes of the metal electrodes 101H, 101L and the metal electrodes 201H, 201L are partially different from each other.

As a result, the occurrence of abnormal discharge which is apt to occur on the end faces of the metal electrodes 101H, 101L or the metal electrodes 201H, 201L can be suppressed.

When the above effect is not emphasized, the planar shapes of the metal electrodes 101H, 101L and the metal electrodes 201H, 201L may be perfectly matched to each other.

Furthermore, among the high-voltage side electrode constituent part 1A and the ground side electrode constituent part 2A (in particular, the dielectric electrodes 111, 211), a gas contacting region which is a region brought into contact with the activated gas is desirably formed of quartz, alumina, silicon nitride, or aluminum nitride as a constituent material.

The surface formed of the constituent material is a chemically stable substance against the activated gas, so that the activated gas can be sprayed from the gas spray holes in a state where the deactivation of the activated gas is suppressed at the gas contacting region brought into contact with the activated gas.

As the basic configuration, the plurality of gas spray holes 55 are formed so as to be equal to each other in shape (diameter when being formed in a circular shape).

On the other hand, a modified configuration is also considered, in which the shapes (diameters) of the plurality of gas spray holes are set to be different from each other between the plurality of gas spray holes 55.

When the modified configuration is adopted in the activated gas generation apparatus of the embodiment 1, the activated gas generation apparatus can exhibit an effect of setting the spray amount to different contents between the plurality of gas spray holes 55.

Application to Film-Formation Treatment Apparatus

The activated gas generating electrode group 301 constituted by combining the high-voltage side electrode constituent part 1A with the ground side electrode constituent part 2A is stored in the housing of the activated gas generation apparatus.

When a film-formation treatment apparatus is constituted by using the activated gas generation apparatus of the embodiment 1, the activated gas generation apparatus of the embodiment 1 corresponds to the activated gas generation apparatus 31 shown in FIG. 15.

Therefore, the film-formation treatment apparatus including the activated gas generation apparatus 31 according to the embodiment 1 allows the activated gas (radical-containing gas) to pass through an inactive space above the central region R50 in a shorter time, so that a high-density activated gas can be supplied to the film formation treatment chamber 33. As a result, a decrease in a film formation temperature when the film is formed on the wafer 34, and a reduction in a treatment time can be achieved.

Furthermore, it is desirable that the plurality of gas spray holes 25 formed in the dielectric electrode 211 of the ground side electrode constituent part 2A have an orifice function, and the film formation treatment chamber 33 is separately provided immediately below the activated gas generation apparatus 31 without providing the orifice forming part 32 so as to directly receive the activated gas sprayed from the plurality of gas spray holes 25.

That is, the film-formation treatment apparatus includes the activated gas generation apparatus 31 of the embodiment 1 and the film formation treatment chamber 33 disposed below the ground side electrode constituent part 2A of the activated gas generation apparatus 31 and subjecting the wafer 34 (substrate to be treated) therein to a film formation treatment using the activated gas. The film formation treatment chamber 33 is desirably constituted so as to directly receive the activated gas sprayed from the plurality of gas spray holes 25.

There will be considered a case where the plurality of gas spray holes 55 formed in the dielectric electrode 211 of the ground side electrode constituent part 2A have the orifice function. In this case, for example, the following environmental setting will be considered: "gas flow rate of source gas: 4 slm; pressure on upstream side of orifice (in activated gas generation apparatus 31): 30 kPa, pressure on downstream side of orifice (in film formation treatment chamber 33): 266 Pa, diameter of gas spray hole 55 (orifice): ϕ1.3 mm; and formation length of gas spray hole 55 (length in Z direction, orifice length): 1 mm".

The film-formation treatment apparatus subjected to the environment setting can directly apply the activated gas to the wafer 34 in the film formation treatment chamber 33 provided immediately below, so that an activated gas having a higher density and a higher electric field can be applied to the surface of the wafer 34, and a higher-quality film formation treatment can be achieved, which provides an effect of easily providing film formation having a high aspect ratio and three dimensional film formation.

It is desirable that, in the film-formation treatment apparatus, the pressure in the discharge space in the activated gas generation apparatus (activated gas generation apparatus 31) of the embodiment 1 is set to 10 kPa to the atmospheric pressure, and the pressure in the film formation treatment chamber 33 is set to be equal to or less than the pressure in the discharge space.

The film-formation treatment apparatus having the above configuration can exhibit an effect of suppressing the attenuation amount of the density of the activated gas according to the pressure setting.

Embodiment 2

Figure 9:
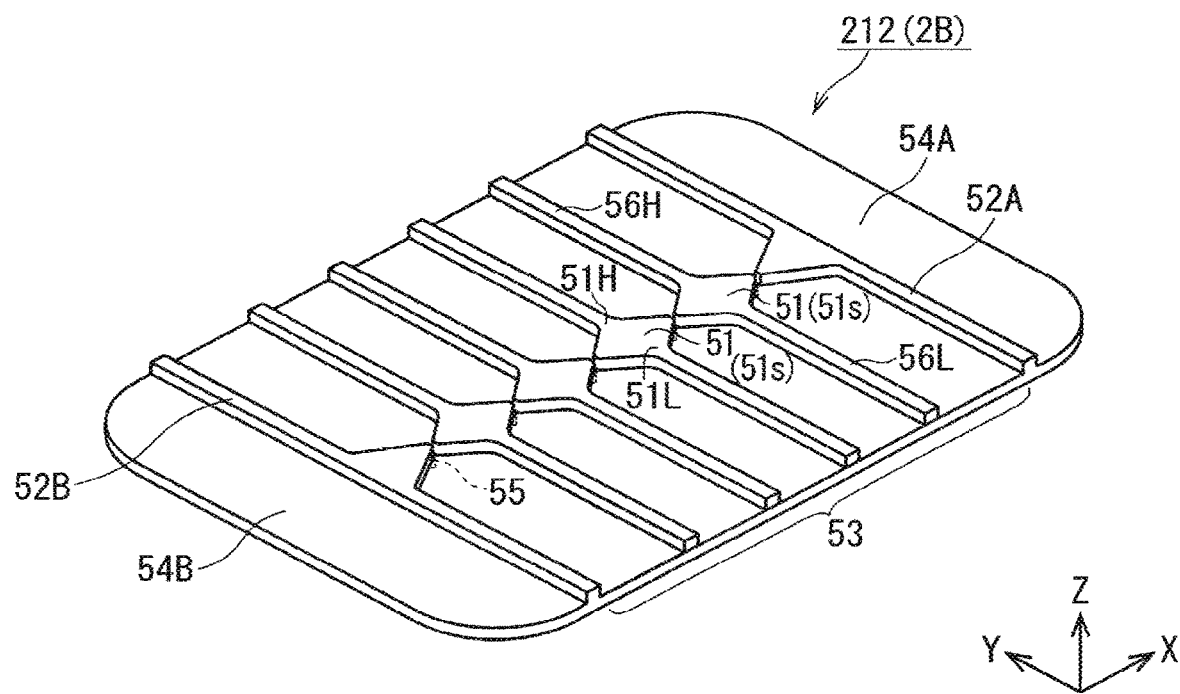
FIG. 9 is a perspective view showing a structure of a dielectric electrode of a ground side electrode constituent part in an activated gas generation apparatus of an embodiment 2.

FIG. 9 is a perspective view showing the structure of a dielectric electrode 212 of a ground side electrode constituent part 2B (second electrode constituent part) in an activated gas generation apparatus of an embodiment 2. In FIG. 9, an XYZ coordinate system is appropriately shown. In the embodiment 2, a basic configuration is adopted, in which the diameters of a plurality of gas spray holes 55 are set to be equal to each other.

The dielectric electrode 212 (second dielectric electrode) further includes four gas flow path partition walls 56H, 56L (a plurality of separation step parts) coupled by end parts 51H, 51L (see FIG. 4) of four rhombic shaped single body parts 51s of a wedge-shaped stepped part 51 (central region step part) and formed so as to protrude upward.

The four gas flow path partition walls 56H, 56L extend in a Y direction, and are formed over the entire length of the dielectric electrode 212 in the Y direction. Specifically, the four gas flow path partition walls 56H are formed so as to extend from the end part 51H of the rhombic shaped single body part 51s of the wedge-shaped stepped part 51 to the upper end part of the dielectric electrode 212 in a +Y direction. The four gas flow path partition walls 56L are formed so as to extend from the end part 51L of the rhombic shaped single body part 51s of the wedge-shaped stepped part 51 to the lower end part of the dielectric electrode 212 in a −Y direction. A gap length in a discharge space is defined by the formation height of each of the four gas flow path partition walls 56H, 56L.

As described above, the four gas flow path partition walls 56H, 56L are formed so that a dielectric space is separated for each of five through holes. The configurations other than the dielectric electrode 212 in the ground side electrode constituent part 2B are similar to those of the high-voltage side electrode constituent part 1A (dielectric electrode 111, metal electrodes 101H, 101L) and the metal electrodes 201H, 201L of the embodiment 1.

As described above, the activated gas generation apparatus according to the embodiment 2 is different from that in the embodiment 1 in that the dielectric space is separated for each of the gas spray holes 55, and the gas flow path partition walls 56H, 56L are additionally provided to partition a gas flow path.

As a result, in the activated gas generation apparatus of the embodiment 2, the shapes (diameters) of the plurality, of gas spray holes 55 are set to be equal to each other, and the plurality of gas flow path partition walls 56H, 56 are provided on the dielectric electrode 212, which makes it possible to equalize the gas flow rate of the activated gas for each of the plurality of gas spray holes 55.

When a modified configuration in which the diameter is changed between the plurality of gas spray holes 55 is minimized, the activated gas generation apparatus of the embodiment 1 which does not have the gas flow path partition walls 56H, 56L is desirably used.

Embodiment 3

Figure 10A:
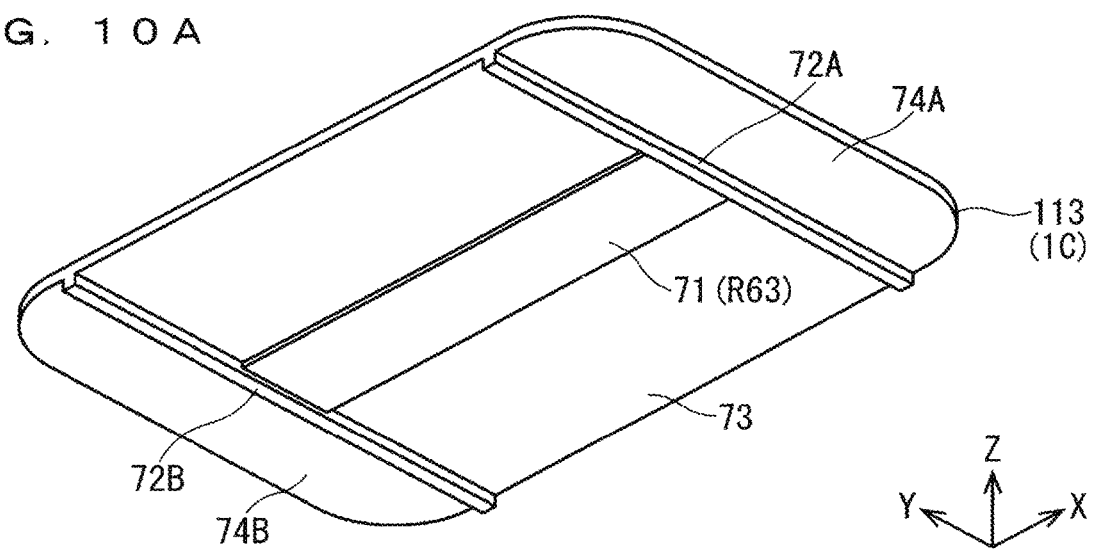
FIGS. 10A to 10C are perspective views showing a configuration of an activated gas generating electrode group 303 in an activated gas generation apparatus of an embodiment 3.
Figure 10B:
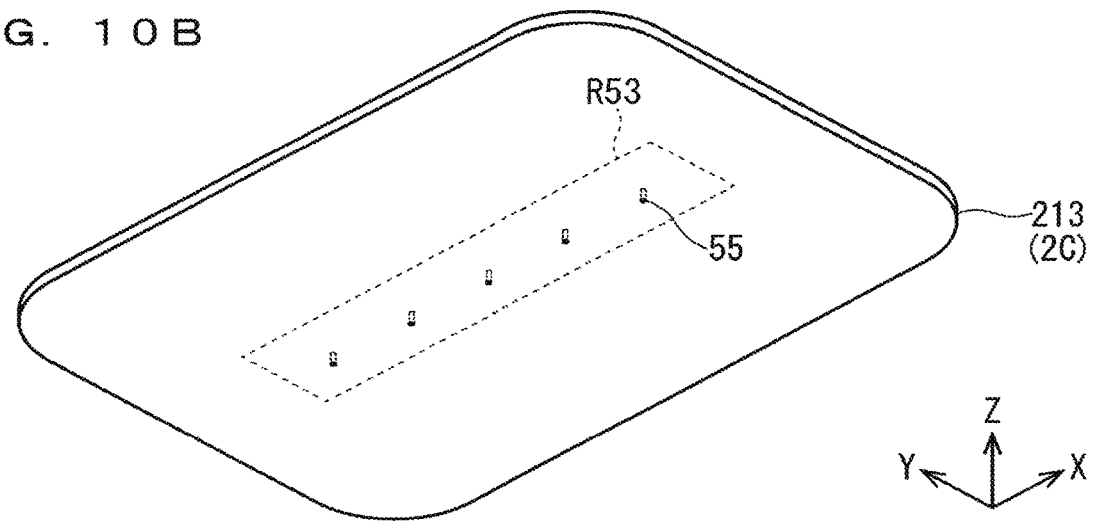
Figure 10C:
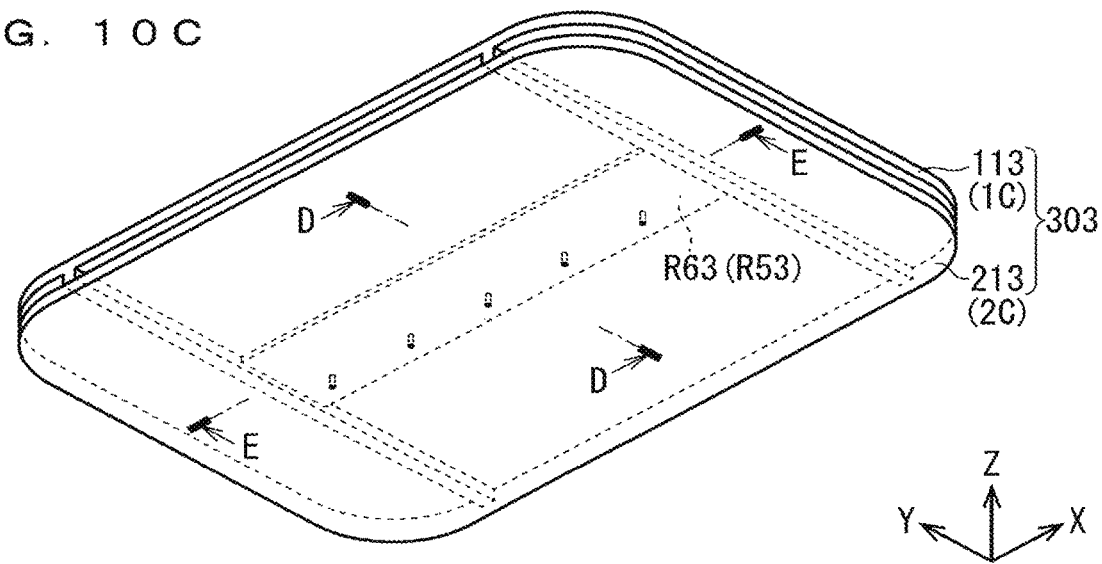
Figure 11A:
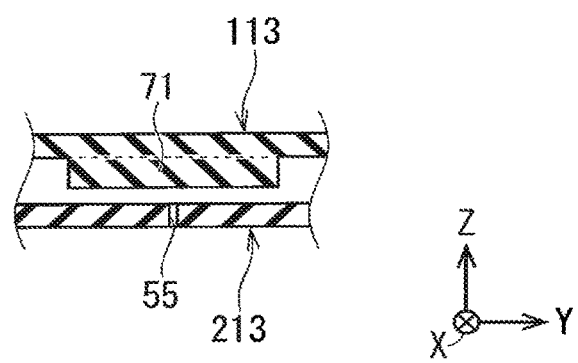
FIGS. 11A and 11B are cross-sectional views showing a cross-sectional structure of the activated gas generating electrode group of FIGS. 10A to 10C.
Figure 11B:
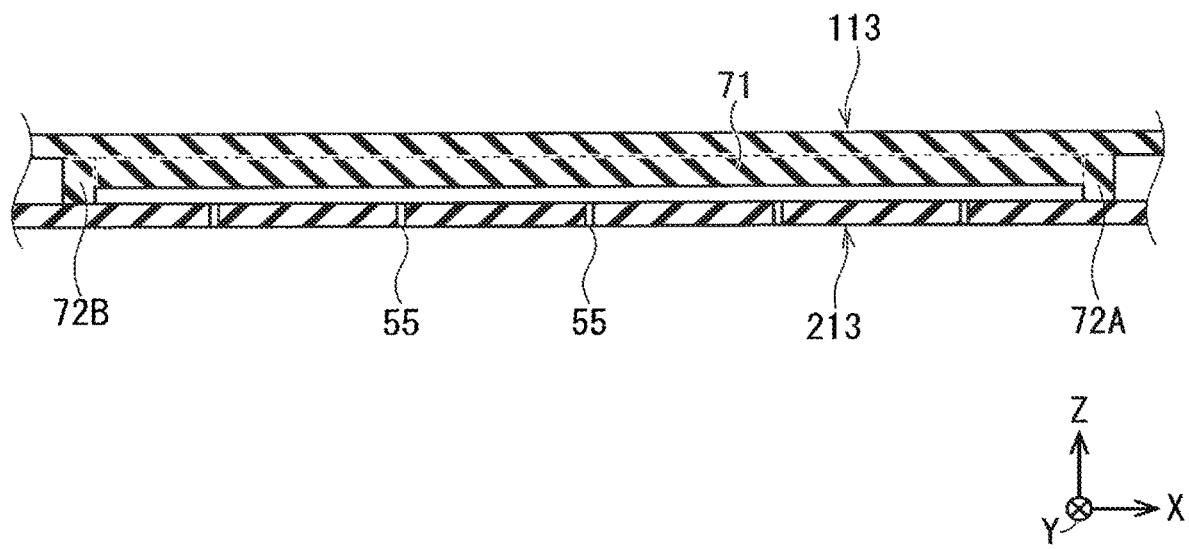

FIGS. 10A to 10C are perspective views showing a configuration of an activated gas generating electrode group 303 in an activated gas generation apparatus according to an embodiment 3. FIGS. 10A and 10B are perspective views showing a structure of each of a dielectric electrode 113 of a high-voltage side electrode constituent part 1C (first electrode constituent part) and a dielectric electrode 213 of a ground side electrode constituent part 2C (second electrode constituent part). FIG. 10C is a perspective view showing a combinational structure (activated gas generating electrode group 303) of the dielectric electrode 113 and the dielectric electrode 213. FIGS. 11A and 11B are cross-sectional views showing a cross-sectional structure of the activated gas generating electrode group 303. FIG. 11A shows a cross-section taken along line D-D of FIG. 10C. FIG. 11B shows a cross-section taken along line E-E of FIG. 10C. In each of FIGS. 10A to 11B, an XYZ coordinate system is appropriately shown.

As shown in FIGS. 10A to 11B, the dielectric electrode 113 and the dielectric electrode 213 have a rectangular flat plate structure with an X direction as a longitudinal direction and a Y direction as a short direction. Hereinafter, in the dielectric electrode 113, with linear stepped parts 72A, 72B described below as boundaries, a central part may be referred to as a main region 73, and both end parts may be referred to as end regions 74A, 74B.

The dielectric electrode 113 (first dielectric electrode) includes a central region step part 71 formed so as to protrude downward in the entire region of a central region R63 (which is equal in shape to the central region R60 in the dielectric electrode 111 of the embodiment 1) in the main region 73.

As with the dielectric electrode 211 of the embodiment 1, the dielectric electrode 213 (second dielectric electrode) has a plurality of gas spray holes 55 formed along an X direction (first direction) in a central region R53 (which corresponds to the central region R63 and is equal in shape to that of the central region R50 in the dielectric electrode 211 of the embodiment) in plan view, and each spraying the activated gas to the outside.

On the other hand, a pair of first partial metal electrodes (first metal electrode), which are not shown in FIGS. 10A to 11B, are formed on the upper surface of the dielectric electrode 113 so as to face each other with the central region R63 (central region step part 71) of the dielectric electrode 113 interposed therebetween in plan view, as with the metal electrodes 101H, 101L of the embodiment 1. The pair of first partial metal electrodes face each other with the X direction (first direction) as the longitudinal direction (electrode formation direction) and the Y direction (second direction) orthogonal to the X direction. The first partial metal electrodes 201H, 201L face each other along the Y direction.

A pair of second partial metal electrodes (second metal electrode), which are not shown in FIGS. 10A to 11B, are formed on the bottom surface of the dielectric electrode 113 so as to have a region overlapping with the pair of first partial metal electrodes in plan view, as with the metal electrodes 201H, 201L of the embodiment 1.

As shown in FIG. 10C, in an aspect in which the central region R63 and the central region R53 are matched to each other in plan view, that is, an aspect in which the central region step part 71 overlaps with all of the plurality of gas spray holes 55 in plan view, the dielectric electrode 113 is laminated on the dielectric electrode 213 and assembled, so that the activated gas generating electrode group 303 of the embodiment 3 can be obtained. In this case, the central region step part 71 is formed over the entire region of the central region R63, and the central region step part 71 can relatively easily overlap with all of the plurality of gas spray holes 55 in plan view, which eliminates the need for strict positioning for the plurality of gas spray holes 55 formed in the dielectric electrode 213.

As shown in FIGS. 11A and 11B, in the dielectric space between the dielectric electrode 113 and the dielectric electrode 213 in the activated gas generating electrode group 303, the presence of the central region step part 71 causes a space below the central region step part 71 (a space where a plurality of gas spray holes 55 are present) to be formed so as to be narrower than the other space.

The activated gas generation apparatus according to the embodiment 3 supplies a source gas from the outside toward below the central region R63 of the dielectric space along the Y direction, so that an activated gas obtained when the source gas passes through the discharge space can be generated, and can be sprayed to the outside from the gas spray holes.

In this case, the presence of the central region step part 71 having a relatively simple structure provided in the dielectric electrode 113 allows the gas flow path of the activated gas corresponding to the plurality of gas spray holes 55 below the central region R63 in the dielectric space to be narrowed down, so that the gas flow rate can be increased. As a result, the high-density activated gas can be generated.

Furthermore, by forming the central region step part 71 in the dielectric electrode 113 and forming the plurality of gas spray holes 55 in the dielectric electrode 213, the central region step part 71 and the plurality of gas spray holes 55 can be separately formed between the dielectric electrode 113 and the dielectric electrode 213, so that the strength of the activated gas generating electrode group 303 can be improved.

That is, the central region step part 71 is provided in the dielectric electrode 113 instead of the dielectric electrode 213, which makes it possible to suppress the possibility of breakage during a metalization treatment when the pair of second partial metal electrodes (corresponding to the metal electrodes 201H, 201L in the embodiment 1) in the ground side electrode constituent part 2C are formed. A plurality of minute gas spray holes 55 are formed in the dielectric electrode 213 of the ground side electrode constituent part 2C, so that stress concentration is apt to occur in a heat treatment or the like during the metalization treatment. Therefore, when the central region step part 71 is provided in the same dielectric electrode 213 in addition to the plurality of gas spray holes 55, the complicated shape is added, which causes a concern that breakage is apt to occur. As a result of which the embodiment 3 can avoid the concern, the embodiment 3 makes it possible to apply a metalization treatment according to an inexpensive printing firing method which includes a heat treatment when the metal electrode is formed.

Furthermore, the dielectric electrode 113 further includes the linear stepped parts 72A, 72B (a pair of end region step parts) formed so as to protrude downward in the boundary region between the main region 73 and the end regions 74A, 74B. The linear stepped parts 72A, 72B are formed so as to extend in the Y direction over the entire length in the short direction of the dielectric electrode 113 in plan view, and a gap length in the discharge space is defined by the formation heights of the linear stepped parts 72A, 72B together with the formation height of the central region step part 71.

The presence of the linear stepped parts 72A, 72B regulates the inflow of the gas into the discharge space from both the end parts in the X direction of the dielectric electrode 113 as with the linear stepped parts 52A, 52B of the embodiment 1.

By providing the linear stepped parts 72A, 72B, a gas inflow path between the high-voltage side electrode constituent part 1C and the ground side electrode constituent part 2C is provided only from two surfaces in the Y direction. Therefore, the gas flow itself is relatively stabilized, so that a pressure distribution in the discharge space is constant, which can provide a uniform discharge space.

As described above, the dielectric electrode 113 further includes the linear stepped parts 72A, 72B, so that, even in the gas spray hole 55 close to both the end parts in the X direction among the plurality of gas spray holes 55 provided in the dielectric electrode 213, the influence of the inflow of the gas or the like from both the end parts causes no phenomenon that the inflow amount of the activated gas changes. This makes it possible to spray the activated gas without causing variations among the plurality of gas spray holes 55. As a result, the pressure distribution is constant, the flow rates of the plurality of gas spray holes 55 are equal to each other, and the activated gas generation apparatus according to the embodiment 3 exhibits an effect of providing the generated radical density relatively equal to each other in the activated gas passing through the discharge space.

Other

In the embodiments described above, the X direction is described as the first direction, and the Y direction intersecting at a right angle to the X direction is described as the second direction. However, the first and second directions may not strictly intersect at a right angle to each other.

However, it is desirable that the first and second directions intersect at a right angle to each other in view of the effect.

While the present invention has been described in detail, the foregoing description is in all aspects illustrative, and the present invention is not limited thereto. It is understood that numerous modifications not illustrated can be devised without departing from the scope of the present invention.

The invention claimed is:

1. An activated gas generation apparatus comprising:
a first electrode constituent part;
a second electrode constituent part provided below said first electrode constituent part; and
an AC power supply part applying an AC voltage to said first and second electrode constituent parts,
said AC power supply part applying said AC voltage to form a discharge space between said first and second electrode constituent parts, and to generate an activated gas obtained by activating a source gas supplied to said discharge space,
wherein:
said first electrode constituent part includes a first dielectric electrode and a first metal electrode selectively formed on an upper surface of said first dielectric electrode;
said second electrode constituent part includes a second dielectric electrode and a second metal electrode selectively formed on a bottom surface of said second dielectric electrode;
a space where said first and second dielectric electrodes face each other is defined as a dielectric space, a region in said dielectric space where said first and second metal electrodes overlap each other in plan view is defined as said discharge space;
said second metal electrode includes a pair of second partial metal electrodes formed so as to face each other with a central region of said second dielectric electrode interposed therebetween in plan view, and said pair of second partial metal electrodes have a first direction as an electrode formation direction and a second direction intersecting with said first direction, the pair of second partial metal electrodes facing each other along said second direction;
said first metal electrode includes a pair of first partial metal electrodes including a region overlapping with said pair of second partial metal electrodes in plan view, and
said second dielectric electrode includes a gas spray hole in said central region for spraying said activated gas to an outside, and a central region step part protrudes upward in said central region; and
said central region step part has a shorter width in said second direction as approaching said gas spray hole in plan view without overlapping with said gas spray hole in plan view.

2. The activated gas generation apparatus according to claim 1,
wherein:
said gas spray hole includes a plurality of gas spray holes along said first direction in said central region; and
said central region step part has a shorter width in said second direction as approaching each of said plurality of gas spray holes in plan view.

3. The activated gas generation apparatus according to claim 2, wherein
a gap length in said discharge space is defined by a height of said central region step part.

4. The activated gas generation apparatus according to claim 3,
wherein:
said second dielectric electrode further includes a pair of end region step parts that protrude upward on both end sides in said first direction;
said pair of end region step parts extend in said second direction in plan view over an entire length in said second direction of said second dielectric electrode; and
the gap length in said discharge space is defined by the height of said central region step part and heights of said pair of end region step parts.

5. The activated gas generation apparatus according to claim 2, wherein
a non-discharge distance which is a distance in said second direction from said discharge space to said plurality of gas spray holes is set to 10 mm or more.

6. The activated gas generation apparatus according to claim 5, wherein
planar shapes of said first and second metal electrodes are provided such that a shortest distance in plan view between said discharge space and said central region step part is equal to or greater than a predetermined reference distance.

7. The activated gas generation apparatus according to claim 1, wherein
planar shapes of said first and second metal electrodes are partially different from each other.

8. The activated gas generation apparatus according to claim 1, wherein
a gas contact region which is a region in contact with the activated gas in said first and second electrode constituent parts is formed of quartz, alumina, silicon nitride or aluminum nitride as a constituent material.

9. The activated gas generation apparatus according to claim 1, wherein
said source gas is a gas containing at least one of nitrogen, oxygen, fluorine, and hydrogen.

10. The activated gas generation apparatus according to claim 2, wherein
shapes of said plurality of gas spray holes are set to be different from each other among said plurality of gas spray holes.

11. The activated gas generation apparatus according to claim 2, wherein:
shapes of said plurality of gas spray holes are set to be equal to each other;
said second dielectric electrode further includes a plurality of separation step parts coupled to said central region step part and protrude upward;
said plurality of separation step parts extend in said second direction;
a gap length in said discharge space is defined by heights of said plurality of separation step parts; and
said plurality of separation step parts are formed such that said dielectric space is separated for each of said plurality of gas spray holes.

12. An activated gas generation apparatus comprising:
a first electrode constituent part;
a second electrode constituent part provided below said first electrode constituent part; and
an AC power supply part applying an AC voltage to said first and second electrode constituent parts,
said AC power supply part applying said AC voltage to form a discharge space between said first and second electrode constituent parts, and to generate an activated gas obtained by activating a source gas supplied to said discharge space, wherein:

said first electrode constituent part includes a first dielectric electrode and a first metal electrode selectively formed on an upper surface of said first dielectric electrode;

said second electrode constituent part includes a second dielectric electrode and a second metal electrode selectively formed on a bottom surface of said second dielectric electrode;

a space where said first and second dielectric electrodes face each other is defined as a dielectric space, a region in said dielectric space where said first and second metal electrodes overlap each other in plan view is defined as said discharge space;

said first metal electrode includes a pair of first partial metal electrodes face each other with a central region of said first dielectric electrode interposed therebetween in plan view;

said pair of first partial metal electrodes have a first direction as an electrode formation direction and a second direction intersecting with said first direction, the first partial metal electrodes facing each other along said second direction;

said second metal electrode includes a pair of second partial metal electrodes including a region overlapping with said pair of first partial metal electrodes in plan view;

said second dielectric electrode includes a plurality of gas spray holes along said first direction in a region corresponding to said central region in plan view and each spraying said activated gas to an outside;

said first dielectric electrode includes a central region step part downward in said central region;

said central region step part overlaps all of said plurality of gas spray holes in plan view; and a first space below said central region step part in said dielectric space is narrower than a second space outside said central region.

13. The activated gas generation apparatus according to claim 12, wherein:

said first dielectric electrode further includes a pair of end region step parts protrude downward on both end sides in said first direction;

said pair of end region step parts extend in said second direction over an entire length of said first dielectric electrode in said second direction; and a gap length in said discharge space is defined by heights of said pair of end region step parts.

14. A film-formation treatment apparatus comprising:

the activated gas generation apparatus according to claim 1; and a film formation treatment chamber disposed below said second electrode constituent part and subjecting a substrate to be treated therein to a film formation treatment using an activated gas, wherein said film formation treatment chamber is disposed so as to directly receive said activated gas sprayed from said gas spray hole of said activated gas generation apparatus.

15. The film-formation treatment apparatus according to claim 14, wherein:

a pressure of said discharge space in said activated gas generation apparatus is set to 10 kPa to an atmospheric pressure; and a pressure in said film formation treatment chamber is set to be equal to or lower than the pressure of said discharge space.

* * * * *